(12) United States Patent
Kim et al.

(10) Patent No.: US 9,489,882 B2
(45) Date of Patent: Nov. 8, 2016

(54) DISPLAY HAVING SELECTIVE PORTIONS DRIVEN WITH ADJUSTABLE REFRESH RATE AND METHOD OF DRIVING THE SAME

(71) Applicant: LG Display Co., Ltd., Seoul (KR)

(72) Inventors: Hyoung-Su Kim, Anyang-si (KR);
Namwook Cho, Paju-si (KR);
TaeHwan Kim, Goyang-si (KR);
Jaemyon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 77 days.

(21) Appl. No.: 14/231,596

(22) Filed: Mar. 31, 2014

(65) Prior Publication Data

US 2015/0243203 A1  Aug. 27, 2015

Related U.S. Application Data

(60) Provisional application No. 61/944,469, filed on Feb. 25, 2014.

(51) Int. Cl.
*G06F 3/038* (2013.01)
*G09G 3/20* (2006.01)
*G09G 3/32* (2016.01)

(52) U.S. Cl.
CPC .......... *G09G 3/2092* (2013.01); *G09G 3/3233* (2013.01); *G09G 3/3291* (2013.01); *G09G 2300/0814* (2013.01); *G09G 2310/0262* (2013.01); *G09G 2310/0272* (2013.01); *G09G 2320/0252* (2013.01); *G09G 2330/023* (2013.01)

(58) Field of Classification Search
CPC ............. G09G 2300/0814; G09G 2310/0262; G09G 2310/0272; G09G 2320/0252; G09G 2330/023; G09G 3/2092; G09G 3/3233; G09G 3/3291
USPC .............. 345/173, 174, 211, 87; 257/40, 71; 438/23
See application file for complete search history.

(56) References Cited

U.S. PATENT DOCUMENTS

| | | | |
|---|---|---|---|
| 2011/0049523 A1 | 3/2011 | Choi et al. | |
| 2011/0109532 A1 | 5/2011 | Choi | |
| 2011/0175097 A1* | 7/2011 | Song et al. | 257/59 |
| 2013/0162617 A1* | 6/2013 | Yoon | G09G 3/3291 345/211 |
| 2014/0078127 A1* | 3/2014 | Lin et al. | 345/211 |
| 2014/0094002 A1 | 4/2014 | Ma | |
| 2014/0299842 A1* | 10/2014 | Kim et al. | 257/40 |

* cited by examiner

*Primary Examiner* — Andrew Sasinowski
*Assistant Examiner* — Kuo Woo
(74) *Attorney, Agent, or Firm* — Fenwick & West LLP

(57) ABSTRACT

There is provided a TFT backplane having at least one TFT with oxide active layer and at least one TFT with poly-silicon active layer. In the embodiments of the present disclosure, at least one of the TFTs implementing the circuit of pixels in the active area is an oxide TFT (i.e., TFT with oxide semiconductor) while at least one of the TFTs implementing the driving circuit next to the active area is a LTPS TFT (i.e., TFT with poly-Si semiconductor).

20 Claims, 18 Drawing Sheets

① Initial
② Sampling & Program
③ Emission

DISPLAY HAVING SELECTIVE PORTIONS DRIVEN WITH ADJUSTABLE REFRESH RATE AND METHOD OF DRIVING THE SAME

This application claims priority to U.S. provisional patent application No. 61/944,469, filed on Feb. 25, 2014, which is hereby incorporated by reference in its entirety.

BACKGROUND

1. Technical Field

The present invention relates to a display, and more particularly, to a display capable of driving selective portions with adjustable refresh rate to reduce power consumption of the display and to improve touch scan capability of the display, as well as a method of driving such display.

2. Description of the Related Art

Flat panel display (FPD) are employed in various electronic devices such as mobile phones, tablets, notebook computers as well as televisions and monitors. Examples of the FPD includes a liquid crystal display (LCD), a plasma display panel (PDP), an organic light emitting diode (OLED) display as well as an electrophoretic display (EPD).

Generally, pixels of the FPDs are arranged in a matrix form, and each pixel generates light (luminescence) upon electrical activation from the driving circuits that have been deposited or integrated onto a thin-film-transistor (TFT) array, so called TFT backplane.

In a display with a conventional driving circuit, a gate signal is sequentially provided to all of the gate lines of the display regardless of the image content to be presented on the display. In this setting, the each and every pixels of the display are loaded with data voltage for every image frame even when some pixels of the display are supplied with the same data voltage. More energy efficient display can be provided if supplying signals to the display can be selectively turned on and/or off according to the image content.

Also, a display with such a conventional driving circuit is also limited in recognizing touch inputs on the display. In way of an example, a display driving session and a touch driving session are separated in operating a display with an in-cell type touch screen so that various electrical noises generated during the display driving session do not negatively affect the touch recognition. As such, the period between each touch scan is limited by the time required to provide a gate signal to all of the gate lines of the display in a continuous and sequential order. More smooth and accurate touch recognition can be provided if more frequent touch scan can be performed without being affected by the noise from the display driving sessions.

Ever growing demands for higher resolution in modern displays adds further to the needs for providing an improved driving circuit and a method that can minimize the waste of power.

BRIEF SUMMARY

As briefly discussed above, it may be desirable to adjust frame rate of a display based on the image content. Lowering the frame rate for at least some part of the display can result in extra power savings, which is one of the most critical issues for mobile devices. However, operating the display with the low refresh rate mode described above may not be feasible with a TFT backplane employing a single type of TFTs. For instance, the driving TFT within the pixel circuit must maintain the stable driving voltage during the period in which the data is not processed by the data driver. Also, the driving voltage may be reduced by a parasitic capacitance while the switching transistor is turned off.

Oxide TFT has excellent voltage holding ratio. However, sensing of the Vth can take significantly longer with an oxide TFT (e.g., as much as 7 times of an LTPS TFT). Also, the size of the oxide TFTs is larger than LTPS TFTs, and using oxide TFTs to implement the driving circuit on a TFT backplane can increase the size of the non-display area that needs to be covered by the bezel. Most importantly, implementing the driving circuit entirely by using the oxide TFTs may not provide sufficient driving frequency during the normal refresh mode of the display.

Accordingly, the embodiments of the present disclosure are directed to a TFT backplane with driving circuits for a display and a method of driving the same to obviate one or more problems due to limitations and disadvantages of the related art. The driving circuit and the method may significantly reduce power consumption by turning off signals to at least some of the pixel circuits in the display for certain image frames, so that image data is processed at low speed refresh mode.

Inventors of the embodiments in the present disclosure recognized that there is a limit in a conventional TFT backplane employing only one kind TFTs as its constituent TFTs. Ever expanding applications of FPDs in devices requiring versatile pixel driving methods adds to the needs for providing a TFT backplane that combines advantages of multiple types of TFTs such as oxide TFTs and LTPS TFTs.

Accordingly, an aspect of the present invention relates to a method of driving pixel circuits so that at least one part of a display area has a frame rate differing from the remaining part of the display area. In an embodiment, the method includes: turning on a first switching thin-film-transistor (TFT) and a second switching TFT in a plurality of pixel circuits to initialize a first node and a second node; turning on the first switching TFT and a third switching TFT to sense a threshold voltage of a driving TFT in the plurality of pixel circuits; turning on the first switching TFT to write a data voltage into a storage capacitor in the plurality of pixel circuits; and turning on the third switching element to cause the driving TFT to supply drive current to an organic light emitting diodes in the plurality of pixel circuits, wherein the first switching TFT and the second switching TFT are formed of oxide TFT, and wherein the third switching TFT and the driving TFT are formed of poly-silicon TFT. A low refresh rate signal is provided to at least one of a driving circuit to adjust frequency of signals supplied to the pixel circuit.

In one embodiment, a gate driver is prevented from supplying at least one gate signal on a gate line connected to the plurality of pixel circuits for a predetermined frames. In some other embodiments, a data driver is prevented from supplying data voltage on a data line connected to the plurality of pixel circuits for a predetermined frames.

In another aspect, a thin-film-transistor backplane that can improve the low refresh mode operation of a display is provided. In an embodiment, there is provided with a TFT backplane having at least one TFT with oxide active layer and at least one TFT with poly-silicon active layer. On the display area of the TFT backplane, a plurality of pixels are formed in a matrix. Each pixel is operated by a pixel circuit therein. On a non-display area of the TFT backplane, at least one driving circuit is configured to drive at least some of the pixel circuits at a plurality of driving frequencies. In yet another aspect, a display device includes a display area having a fast frame rate area and a low frame rate area. This display has a thin-film-transistor (TFT) backplane with a plurality of pixel circuits in the display area and at least one gate driver in a non-display area of the TFT backplane. The gate driver in the non-display area of the TFT backplane is configured to provide gate signals to the pixel circuits in the fast frame rate area at a first frequency and to provide gate signals to the pixel circuits in the low frame rate area at a second frequency lower than the first frequency.

It should be noted that the embodiments described in the present disclosure are not intended to be bound or otherwise be limited by any express or implied theory presented in the preceding background and brief summary. It should also be appreciated that the following detailed description is merely exemplary in nature and is not intended to limit the embodiments or the application and uses thereof. Hereinafter, exemplary embodiments will be described in detail with reference to the accompanying drawings.

DETAILED DESCRIPTION OF THE PREFERRED EMBODIMENT

Figure 1:
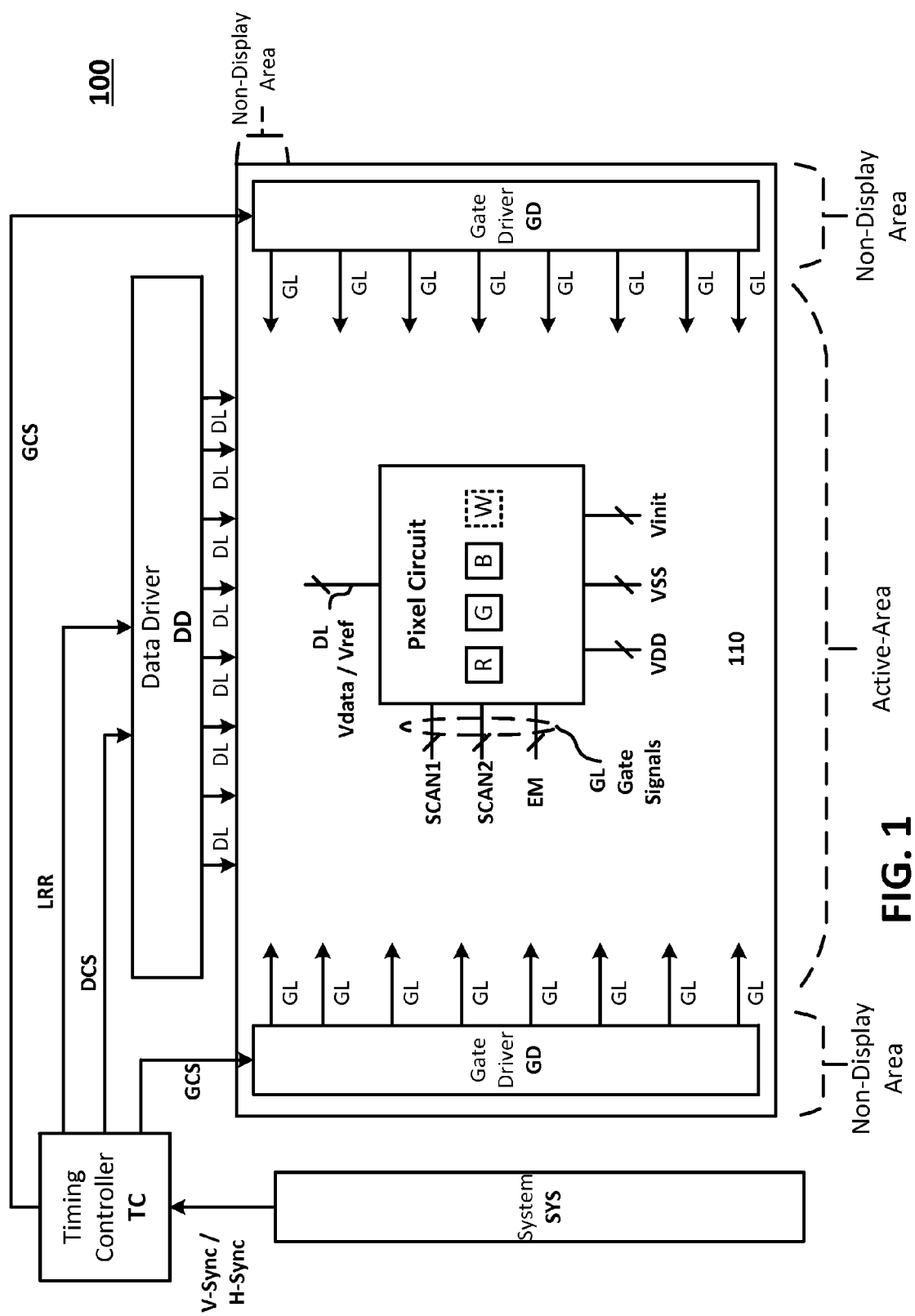
FIG. 1 is a schematic diagram illustrating a display having an active area and a non-display area.

Various features and advantages described in the present disclosure will be more clearly understood from the following description with reference to the accompanying drawings. Note that the accompanying drawings are merely illustrative and may not be drawn to scale for easier explanation. Also, components having the same or similar function may be denoted by the same reference symbols/numeral throughout the drawings for describing various embodiments. The descriptions of the same or similar components may be omitted.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Further, it will be understood that when an element is referred to as being "overlapped" with another element, at least some portion of one element can be positioned above or below the other element. Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of exemplary embodiments.

Respective features of various exemplary embodiments of the present invention can be partially or totally joined or combined with each other and as sufficiently appreciated by those skilled in the art, various interworking or driving can be technologically achieved and the respective exemplary embodiments may be executed independently from each other or together executed through an association relationship. Hereinafter, various embodiments of the present invention will be described in detail with reference to the accompanying drawings.

A TFT backplane is an important part of a FPD as it functions as a series of switches to control the current flowing to each individual pixel. Until recently, there have been two primary types of TFT backplane technologies, one using TFTs with amorphous silicon (a-Si) active layer and the other using TFTs with polycrystalline silicon (poly-Si) active layer.

A TFT with a-Si active layer generally has lower carrier mobility (μ) than that of a TFT with poly-Si active layer. Thus, making a high speed drive circuit (e.g., pixel circuit, gate drive integrated circuit, data drive integrated circuit) for a display is difficult with the TFT backplane employing a-Si TFTs.

A layer of amorphous silicon can be subjected to a heat-treatment using a laser beam to form polycrystalline silicon active layer. The material from this process is generally referred to as low-temperature polycrystalline silicon (LTPS). In general, the carrier mobility (μ) of LTPS TFTs is higher than the a-Si TFTs by as much as 100 times (>100 cm2/V·s). Despite the higher carrier mobility (μ), LTPS TFTs of a backplane tend to have variations in their threshold voltages (Vth) due to the existence of grain boundaries. Such non-uniform threshold voltages among the TFTs employed in a TFT backplane result in display non-uniformity referred to as the "mura." For this reason, a display drive circuit implemented with LTPS TFTs often requires a complex compensation circuit, which in turn, increases the manufacturing time and cost of the display.

For flexible displays, a-Si TFTs or LTPS TFTs the backplane must be formed at temperatures sufficiently low to prevent thin plastic or glass substrates from degrading. However, lowering the temperature during the fabrication process degrades the performance of the TFTs, limiting their use for flexible displays.

Such disadvantages of the silicon based TFTs called for yet another type of backplane technology, which employees TFTs having their active layer formed of a metal oxide material. In particular, oxide TFTs offer an attractive alternative to silicon based TFTs because of their high mobility (>10 $cm^2$/V.s) and low process temperature (<250° C.), compared to those of a-Si TFTs. The lower leakage current and the scalability to any glass size make the oxide TFT a promising candidate for making a high performance TFT backplane for displays at low cost.

Stable and high-yield production of a TFT backplane employing oxide TFTs requires optimization of the TFT design, dielectric and passivation materials, oxide film deposition uniformity, annealing conditions, and more. Also, manufacturing process variations make it difficult to tightly control the operating characteristics of such TFTs, including their threshold voltages, Vth. For example, adopting the etch-stopper type oxide TFTs can improve the reliability, but such a design suffers from high parasitic capacitance and complicates the manufacturing process. Further, the etch-stopper type limits how short the TFT channel can be, thereby affecting the overall size of the display backplane or the aperture ratio in the pixels of the display. As such, the task of designing the driving circuitry for a display becomes fairly complex in view of such constraints.

FIG. 1 illustrates an exemplary flat panel display (FPD) 100 according to an embodiment of the present disclosure. The display 100 may be implemented with a self-emitting organic light-emitting diode (OLED) or a liquid crystal (LC) material. While the embodiments of the present disclosures are described in reference to an OLED display, it should be appreciated that the embodiments of the present disclosure are also applicable to LCD display.

The display 100 can be defined in an active area (i.e., display area) and a non-active area (i.e., non-display area). In the display area, a plurality of display pixels is arranged in a matrix. Each of the display pixels is associated with a pixel circuit implemented with one or more capacitors and thin-film-transistors (TFTs) that are configured to receive various signals from the driving circuits. The TFTs for implementing the pixel circuits may be formed on various types of substrates, such as a glass substrate, a plastic substrate, or other suitable substrate, which may be referred to a TFT substrate or TFT backplane 110.

In operating the display 100, various circuits and components may operate together to provide signals and/or voltages to the pixel circuits in the display area. Non-limiting examples of the circuits and components that may be needed in operating the display 100 include a system (SYS), a timing controller (TC), a data driver (DD), a gate driver (GD), and the like. Circuits and components necessary in operating the display may vary depending on the type of the display 100 (e.g., OLED, LCD, etc.).

Some of these components may be integrated into a package. For instance, the timing controller TC and the data driver DD, may be integrated into a single package, which may be collectively referred to as a display driver integrated circuit (display D-IC). The display D-IC may be mounted to an interface (not shown) in the non-display area of the TFT substrate 110 using the chip-on-glass (COG) technology, via tape-carrier-package (TCP) or Chip-on-Film (COF) technology.

The display D-IC may include various other circuits serving different functionalities in operating the display 100. For example, the display D-IC may include storage circuits such as volatile and non-volatile memory circuits, solid state drives, hard drives, and other memory and storage circuitry. The display D-IC may also include processor such as processing circuitry in a microprocessor or other processor. Examples of integrated circuits that may be included in display driver-IC include microprocessors, digital signal processors, power management units, baseband processors, microcontrollers, application-specific integrated circuits, circuits for handling audio and/or visual information, and other control circuitry.

Some driving circuits may be formed on a separate substrate and connected to the TFT substrate 110 to transmit signals to the display pixels. In the embodiments of the present disclosure, at least one of the various driving circuits for providing a signal and/or voltage to the pixel circuits is implemented with one or more TFTs formed in the non-active area (i.e., non-display area) of the TFT substrate 110. In way of example, one or more gate driver GD can be formed in the non-display area of the TFT substrate 110 using the gate-in-panel (GIP) technology as shown in FIG. 1. It should be noted that the number of gate driver GD on the TFT substrate 110 is not particularly limited. For instance, one gate driver or more than two gate drivers may be formed in the non-display area of the TFT substrate 110.

While the data driver DD can be integrated in the display D-IC mounted to the TFT by using COG, TCP or COF, in some embodiments, the data driver DD or at least part of the data driver DD can be implemented with TFTs fabricated in the non-display area of the TFT backplane 110 in the similar fashion (i.e., GIP technology) as the gate driver GD. For instance, the data driver DD may include one or more of source drive IC, buffers and multiplexers, which may be implemented directly on the TFT backplane 110.

As such, it should be appreciated that circuits, which can be fabricated with TFTs in the non-display area of the TFT substrate 110, is not particularly limited. Any circuits for operating the display 100 can be fabricated in the non-display area of the TFT substrate 110 so long as they can be implemented by with TFTs on the TFT substrate 110. Depending on the type of the display 100 and its driving method, additional circuits, such as an emission driver ED, inverter, multiplexer, de-multiplexer and the like, may be used in operating the display 100, and they may be implemented with the TFTs fabricated in the non-display area of the TFT substrate 110.

The system SYS may be configured to provide vertical synchronization signal, horizontal synchronization signal, clock signal, and image data through a transmitter of a graphic controller to appropriate circuits. For instance, the vertical/horizontal synchronization signal and clock signal from the system SYS are provided to the timing controller TC. The image data from the system SYS is also provided to the timing controller TC.

The timing controller TC receives the horizontal synchronization signal, the vertical synchronization signal, a data enable signal, a clock signal, and image data from an interface circuit (not shown). The vertical synchronization signal indicates time required to display an image of one frame. The horizontal synchronization signal indicates time required to display one horizontal line of an image, that is, one pixel line. Thus, the horizontal synchronization signal includes pulses equal in number to the number of pixels included in one pixel line. The data enable signal indicates a period in which valid image data are positioned.

The timing controller provides a gate control signal GCS to the gate driver GD and a data control signal DCS to the data driver DD.

The gate control signal GCS applied to the gate driver GD may include a gate start pulse signal GSP, a gate shift clock signal GSC, a gate output enable signal GOE, and so on. The gate start pulse signal GSP is a signal for control of timing of a first gate signal of the gate driver GD, the gate shift clock signal GSC is a signal for sequentially shifting and outputting the gate start pulse signal GSP, and the gate output enable signal GOE is a signal for control of output timing of the gate driver GD.

The timing controller TC rearranges image data such that image data having a predetermined bit, which is provided from the interface, may be provided to the data driver DD. For example, the timing controller TC may supply data driver DD with digital data corresponding to text, graphics, video, or other images to be displayed on display 100. The data driver DD may convert the data that is received from the timing controller TC into signals for controlling the display pixels.

A data control signal DCS provided to the data driver DD may include a source sampling clock signal SSC, a source output enable signal SOE, a source start pulse signal SSP, and so on. The source sampling clock signal SSC is used as a sampling clock for latching image data by the data driver DD and to determine a driving frequency of the data driver DD. The source output enable signal SOE is used to transmit the image data latched by the source sampling clock signal SSC to appropriate pixels. The source start pulse signal SSP is a signal indicating beginning of latch or sampling of the image data for one horizontal period. When the display is an LCD display, the data control signal DCS may also include a polarity reverse signal for reversing the polarity of the data voltage Vdata from the data driver DD.

In addition, the timing controller TC may be used in running various software for operating the display 100. For example, the timing controller may be configured to execute code in connection with the displaying of images on display 100 (e.g., text, pictures, video, etc.), the timing controller TC may be configured to run testing software (e.g., code that is used during manufacturing to support interactions between display 100 and test equipment), timing controller TC may be configured to run code that allows the timing controller TC to adjust operating settings (e.g., to store calibration data or other settings in storage in the control circuitry such as non-volatile storage), etc.

As will be described in greater detail below, the timing controller TC can also be configured to adjust the frame rate of at least some part of the display area 100. In this regard, the timing controller TC can provide a low refresh rate signal LRR to a switching circuit coupled to the data driver DD and/or gate driver GD, so that the frequency of signals (e.g., scan signal, emission signal, data signal) provided to pixel circuits in the display area can be adjusted.

In some embodiments, the output of the LRR signal may be controlled by the system SYS. The system SYS may be configured to analyze the image data and control the state of the LRR signal to the appropriate driving circuits. In some cases, the image data provided to the system SYS may include various data that can be used by the system SYS in generating the LRR signal. Non-limiting examples of the information that may be provided to the system SYS includes information indicative of the type of image data, information indicative of dimension and location of the image content to be applied with an adjusted frame rate, and information indicative of appropriate frame rate.

It should be appreciated that the output of the low refresh rate signal LRR from the timing controller TC can be triggered by various other ways. For instance, if the display 100 is used in a device that provides a specific mode in which the image content can be displayed at a low frame rate (e.g., mode for displaying time on a screen, mode for displaying static user interface, etc.), the low refresh rate signal LRR can be set to high upon the device entering into such a mode. Likewise, exiting from such a low frame rate mode can set the low refresh rate signal LRR back to low. Triggering of the low frame rate mode can be controlled by software implemented in the system SYS or the timing controller TC. It can also be triggered by receiving a user command via a touch interface and/or a physical button.

As mentioned, the data driver DD receives digital image data from the timing controller TC. The data driver DD may be configured to convert the digital image data into gamma correction voltages to generate data voltages Vdata, in response to data control signal DCS from the timing controller TC. And then, the data driver DD may supply the data voltages Vdata to the data lines DL of the display 100 in synchronization with the gate control signal GCS from the gate driver GD. As will be described in greater detail below, in some embodiments, the data driver DD may be configured to output data voltages Vdata in a limited frequency rate in response to the low refresh rate signal LRR from the timing controller TC.

The gate driver GD controls on/off of TFTs in pixels in response to the gate control signal GCS input from the timing controller TC and allows data voltages Vdata applied from the data driver DD to be applied to the appropriate pixel circuit. To this end, the gate driver GD sequentially outputs gate signals (e.g., Scan signals, emission signals) and sequentially applies the gate signals to the gate lines GL. When the gate signals are provided on a gate line GL, the data voltages Vdata may be applied to the sub-pixels R, G, and B (or W, R, G and B) of pixel circuits connected with that particular gate line GL. As will be described in further detail below, in some embodiments, the gate driver DD may be configured to pause sending out gate signals on certain gate lines in response to receiving the low refresh rate signal LRR from the timing controller TC.

The data lines DL and gate lines GL of the exemplary display 100 may cross each other in the active area, and each pixel circuits may be formed at the crossing of a data line DL and a gate line GL. The pixels may be formed of liquid crystal display (LCD) components, organic light-emitting diode (OLED) components or other suitable display pixel structures. As such, the configuration of TFTs and capacitors implementing the pixel circuit may vary depending on the type of the display component as well as the driving methods for activating the pixel.

Each of the pixels may include red sub-pixel R for displaying red color, green sub-pixel G for displaying green color, and blue sub-pixel B for displaying blue color. It should be noted that the arrangement of the sub-pixels in the active area is not particularly limited. Further, in some embodiments, at least some of the pixels in the display 100 may employ white pixel or white sub-pixel as shown in FIG. 1.

Assuming the display 100 in FIG. 1 is an OLED display, each pixel of the display 100 may include at least one switching TFT, a driving TFT, an organic light emitting diode, and at least one capacitor. Each pixel can be connected to the data line DL and the gate line GL through the switching TFTs such that each pixel receives a data voltage Vdata from the data driver DD through the data line DL and a gate signals from the gate driver GD through the gate line GL. In some embodiments, the display 100 may include an emission driver ED (which may be a part of the gate driver GD), which provides an emission signal EM to each of the pixels. Each pixel emits light according to the current flowing to the organic light emitting diode, which is controlled by the switching TFT and the driving TFT. The display 100 can be implemented as a bottom emission structure, a top emission structure or dual emission (i.e., top and bottom) structure.

Figure 2A:
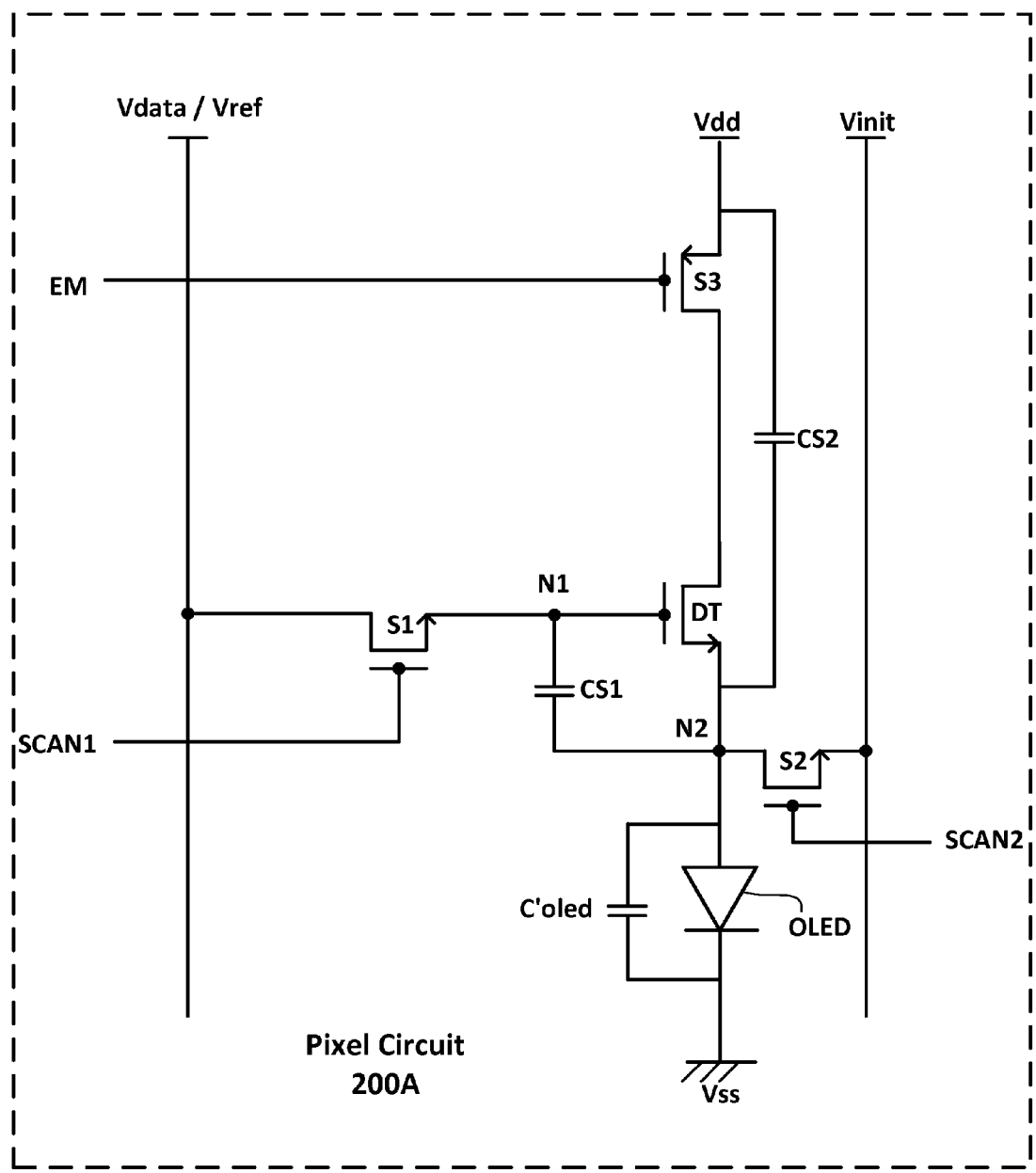
FIGS. 2A, 2B, and 2C are circuit diagrams of each pixel according to other embodiments of the present invention, respectively.
Figure 2B:
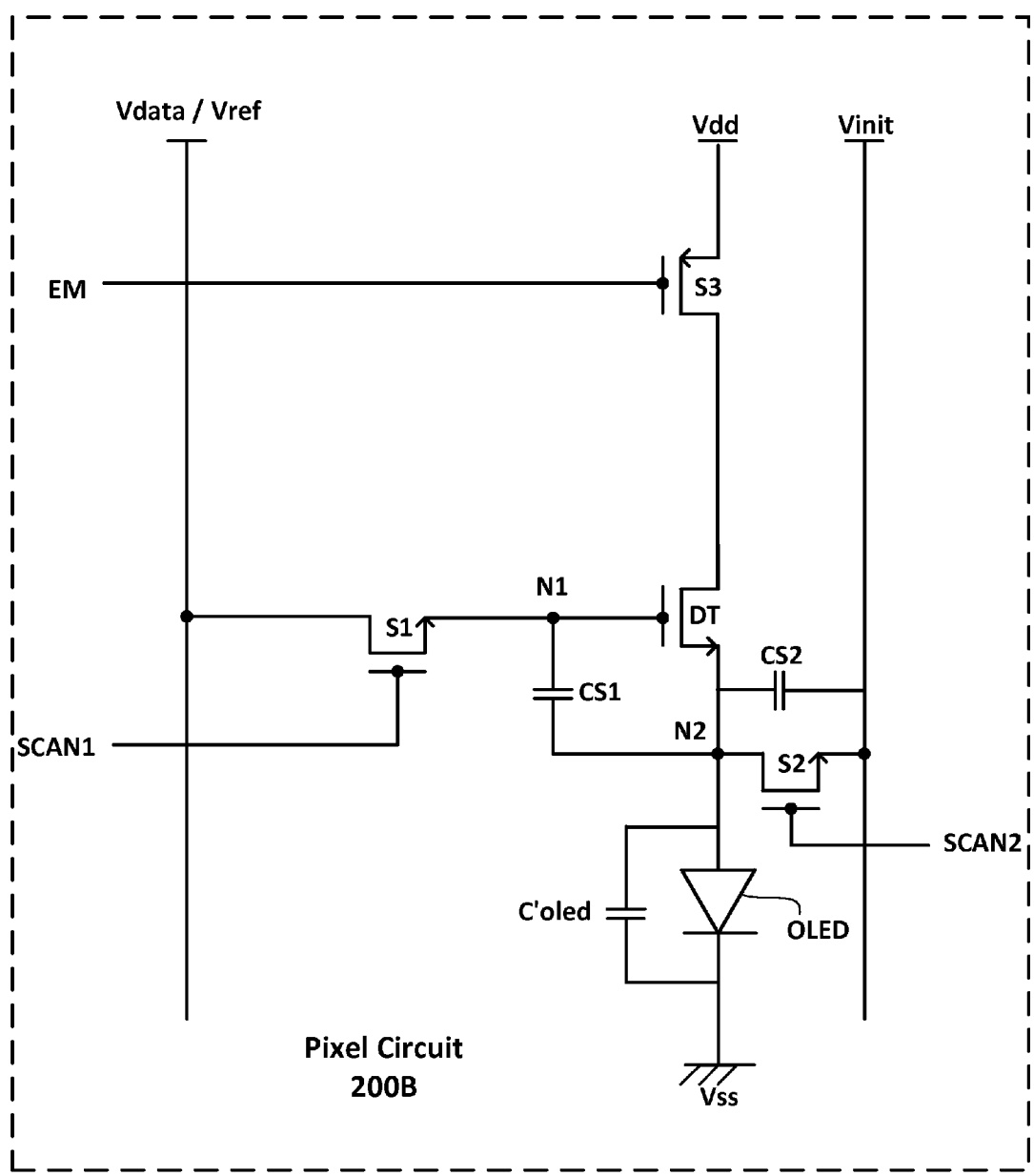
Figure 2C:
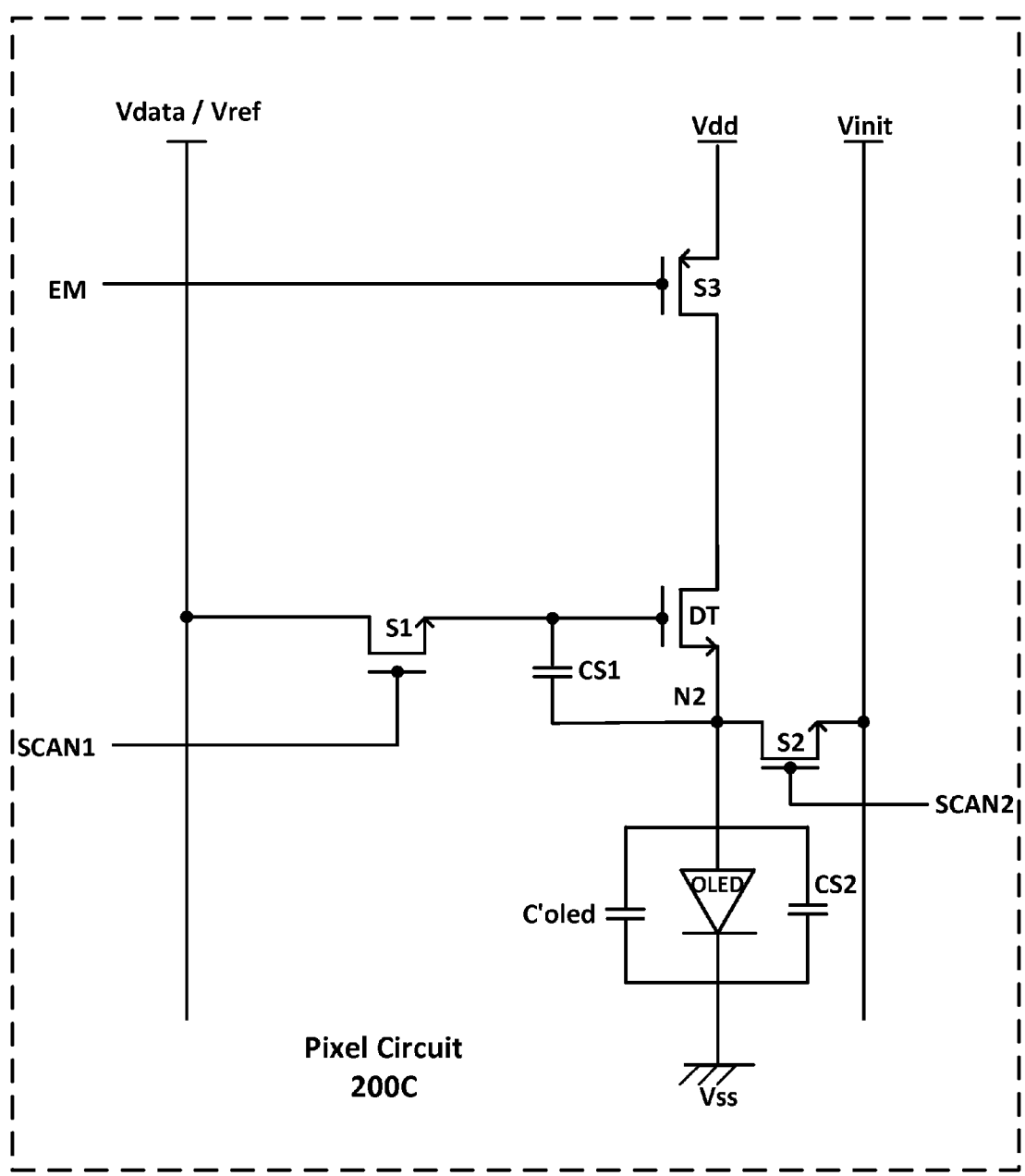
Figure 3A:
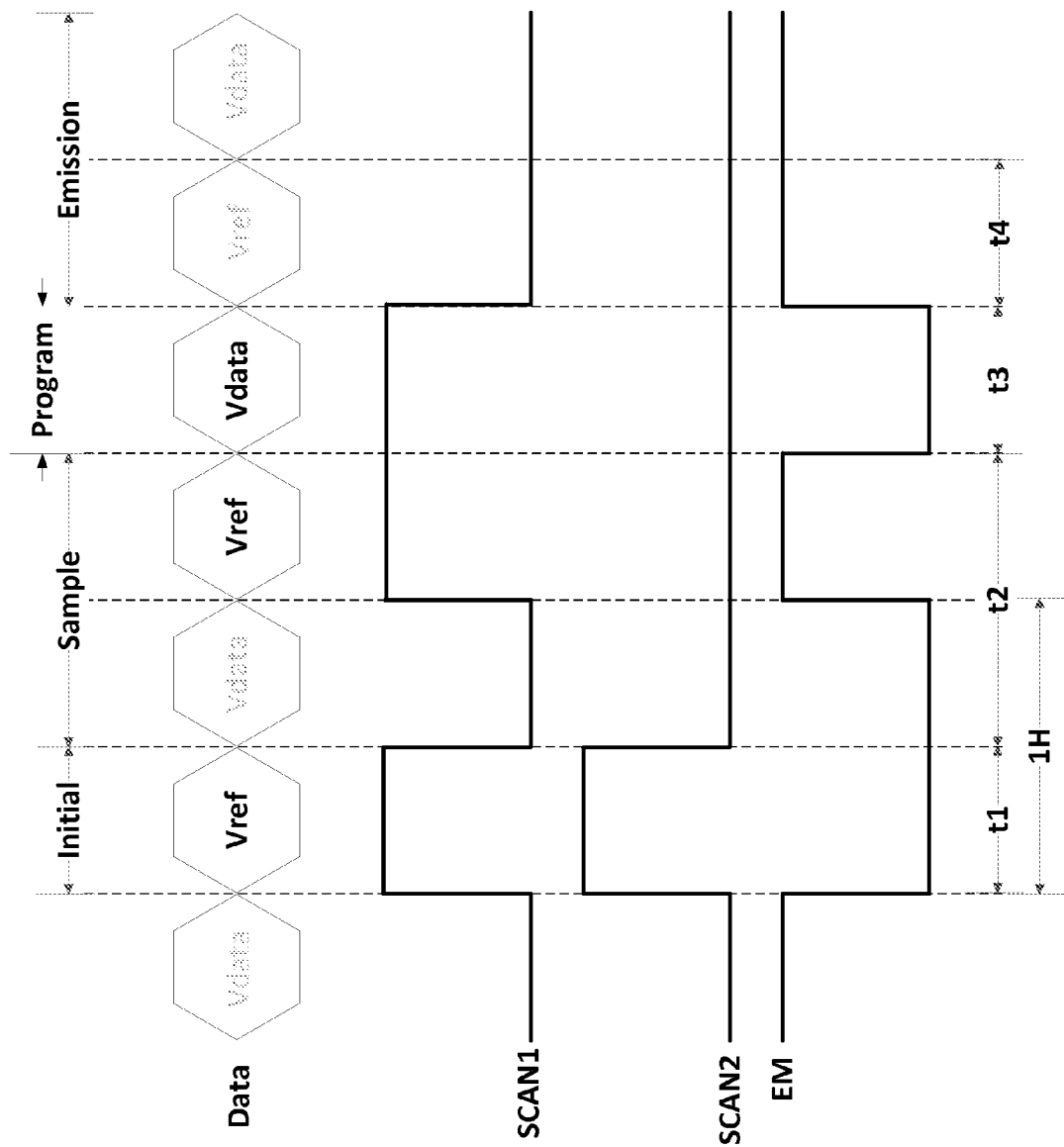
FIG. 3A is a timing diagram illustrating the operation of the pixel circuits of FIGS. 3A-3C.
Figure 3B:
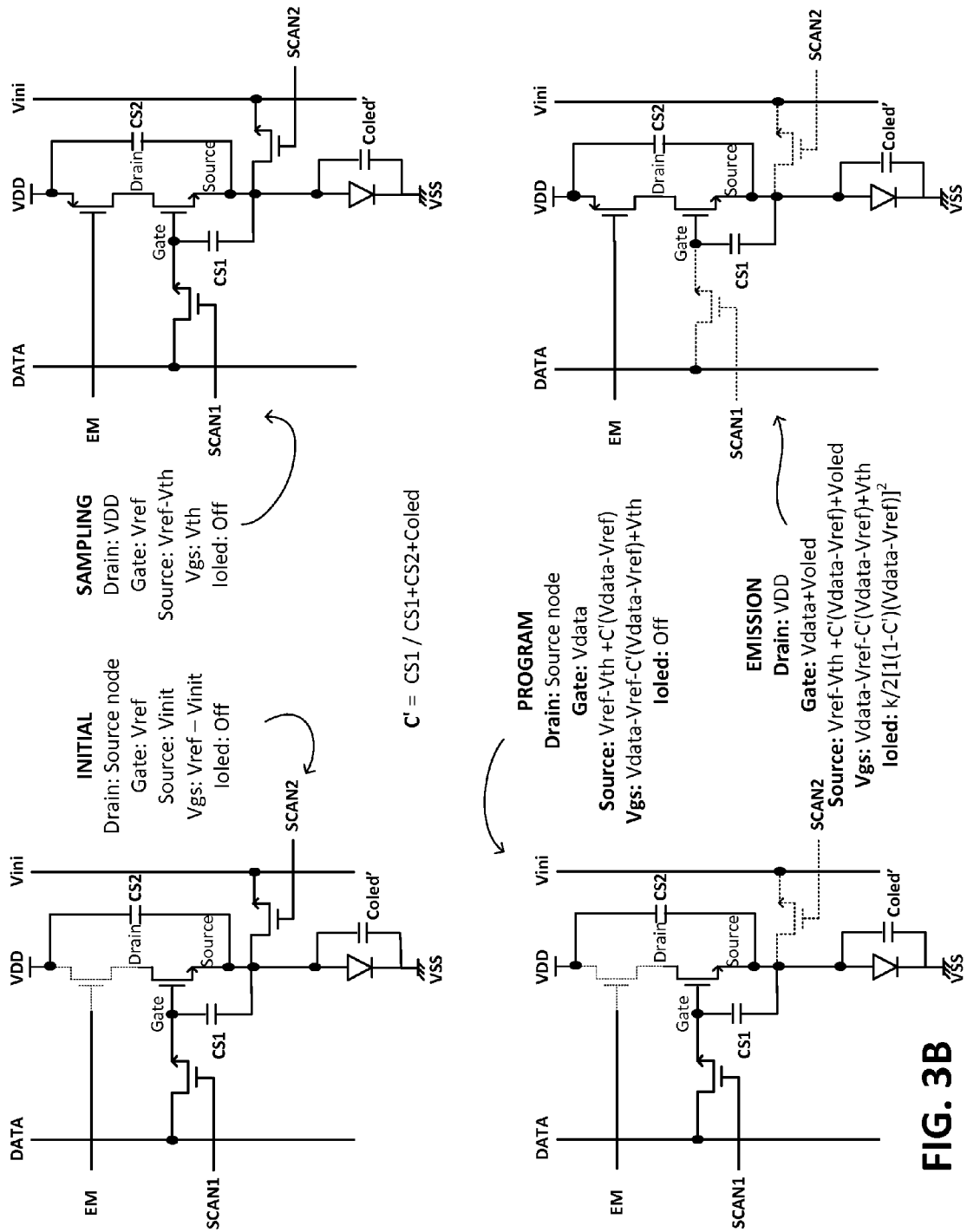
FIG. 3B is a detailed illustration explaining the operation of the pixel circuits of FIGS. 2A-2C.

FIGS. 2A-2C illustrate configuration of an exemplary pixel circuits of an OLED display employing multiple types of TFTs. FIGS. 3A and 3B illustrate an exemplary operation of the pixel circuit of FIG. 2A-2C. In this example, each pixel of a display 100 includes an OLED, and each pixel circuit 200A including a driving TFT DT, first to third switching TFTs S1 to S3, and first and second capacitors CS1 and CS2, respectively. This arrangement may be referred in the present disclosure as a 4T2C pixel circuit.

The exemplary pixel circuit 200A operates in a plurality of periods divided in accordance with a plurality of gate signals supplied to the pixel circuit 200A, namely, an initialization period t1, a sampling period t2, a programming period t3, and an emission period t4.

The first switching TFT S1 is turned on or off based on the state of the first scan signal SCAN1. Turning the first switching TFT S1 on connects the data line DL to the first node Ni, which is connected to the gate of the driving TFT DT. High level first scan signal SCAN1 is provided to the first switching TFT S1 during the initialization period t1 and the sampling period t2 to turn on the first switching TFT Si. During the initialization period t1 and the sampling period t2, the data line DL supplies the reference voltage Vref, which is provided to the first node N1 via the first switching TFT Si. The first switching TFT S1 is provided with high level first scan signal SCAN1 during the programming period t3 as well. During the programming period t3, the data line DL provides data voltage Vdata, such that the switching TFT S1 supplies the data voltage Vdata to the first node N1.

The second switching TFT S2 is turned on or off based on the state of the second scan signal SCAN2. During the initialization period t1, the second switching TFT S2 is turned on such that the initialization voltage Vinit is provided to the second node N2, which is connected to a source of the driving TFT DT.

The third switching TFT S3 is turned on or off based on state of the emission signal EM. The third switching TFT S3 may be configured to provide the voltage Vdd from the Vdd supply line to a drain of the driving TFT DT during the sampling period t2 and the emission period t4.

The OLED has one terminal receiving a high potential driving voltage Vdd and another terminal receiving a low potential driving voltage Vss. The OLED emits light by a current flowing between the two terminals. The driving TFT DT is connected in series between the Vdd supply line and the Vss supply line, together with the OLED. The driving TFT DT controls an amount of current flowing in the OLED depending on a voltage difference between a gate and a source of the driving TFT DT. In the emission period t4, the driving TFT DT supplies drive current loled to the OLED.

In this exemplary pixel circuit, the first capacitor CS1 is connected between the first node N1 and the second node N2. The first capacitor CS1 stores the threshold voltage (Vth) of the driving TFT DT in the sampling period t2. The second capacitor CS2 is connected between the Vdd supply line and the second node N2. The second capacitor CS2 is connected to the first capacitor CS1 in series, thereby reducing the capacity ratio of the first capacitor CS1. Reducing the capacity ratio of the first capacitor CS1 within the pixel circuit allows more efficient use of the data voltage Vdata applied to the first node N1 during the programming period t3. The second capacitor CS2 enhances the luminance of the OLED with the same data voltage Vdata.

As illustrated in FIG. 2B, the second capacitor CS2 may be connected between the Vinit supply line and the second node N2. Alternatively, the second capacitor CS2 may be connected between the VSS supply line and the second node N2, as illustrated in FIG. 2C. The exemplary operation illustrated in FIGS. 3A-3B can be applied to all of the exemplary pixel circuits shown in FIGS. 2A-2C.

In operation, the first and second switching TFTs S1 and S2 are turned on in the initialization period t1. Then, the reference voltage Vref is supplied to the first node N1 via the first switching TFT Si. The initial voltage Vinit is supplied to the second node N2. As a result, the pixel is initialized.

Subsequently, in the sampling period t2, the first and third switching TFTs T1 and T3 are turned on. The first node N1 sustains the reference voltage Vref. In the driving TFT DT, current flows toward the source in a state in which its drain is floated by the high level voltage VDD. When the source voltage of the driving TFT DT is equal to "Vref−Vth", the driving TFT DT is turned off. Here, "Vth" represents the threshold voltage of the driving TFT DT.

In the programming period t3, the first switching TFT S1 is turned on, and the data voltage Vdata is supplied to the first node N1 via the first switching TFT Si. As a result, the voltage of the second node N2 is changed to "Vref−Vth+C' (Vdata−Vref)" due to a coupling phenomenon within the pixel circuit, resulting from the voltage distribution by the in-series connection of the first and second capacitors CS1 and CS2. Here, "C" represents "CS1/(CS1+CS2+C'oled)". "C'oled" represents the capacitance of the OLED.

In the emission period t4, the third switching TFT S3 is turned on. Then the high level voltage VDD is applied to the drain of the driving TFT DT via the third switching TFT S3. As a result, the driving TFT DT supplies the drive current. In this configuration, the drive current supplied from the driving TFT DT to the OLED can be expressed by the following equation: ½×K (Vdata−Vref−C'(Vdata−Vref))2. Here, "K" represents a constant determined in accordance with a mobility of the driving TFT DT and a parasitic capacity of the driving TFT DT.

As it can be recognized from the equation above, the third switching TFT S3 employed in the exemplary pixel circuits of FIG. 2A, FIG. 2B and FIG. 2C suppresses the driving TFT DT to be turned on during the programming period t3 by the voltage Vdd from the Vdd supply line. Further, the pixel circuit employs the capacitor CS1 and the capacitor CS2 to meet the capacitance size that is capable of providing the desired voltage holding ratio (e.g., Voltage Holding Ratio >99%) for the pixel circuit. This configuration can reduce the current leakage from the first switching TFT S1, allowing to sustain the voltage at the gate of the driving TFT DT. The stable voltage at the gate of the driving TFT DT enables more efficient use of the data voltage Vdata during the programming period t3.

As such, the drive current of the OLED is not influenced by the threshold voltage of the driving TFT DT and the high level voltage Vdd. The configuration of the pixel circuit described above compensates Vth differences between the driving TFTs in the pixels as well as the voltage drop of the high level voltage Vdd, thereby reducing unwanted display non-uniformity. Further, the mobility deviation of the driving TFT DT can be compensated by adjusting the ascending time of the emission signal EM transitioning from a low state to a high state at a start point of the emission period t4.

As briefly discussed above, it may be desirable to adjust frame rate of a display based on the image content. Lowering the frame rate for at least some part of the display can result in extra power savings, which is one of the most critical issues for mobile devices. Combined use of oxide TFTs and LTPS TFTs in a TFT backplane can be facilitate such a display.

As briefly discussed above, it may be desirable to adjust frame rate of a display based on the image content. Lowering the frame rate for at least some part of the display can result in extra power savings, which is one of the most critical issues for mobile devices. Combined use of oxide TFTs and LTPS TFTs in a TFT backplane can be facilitate such a display.

Figure 4:
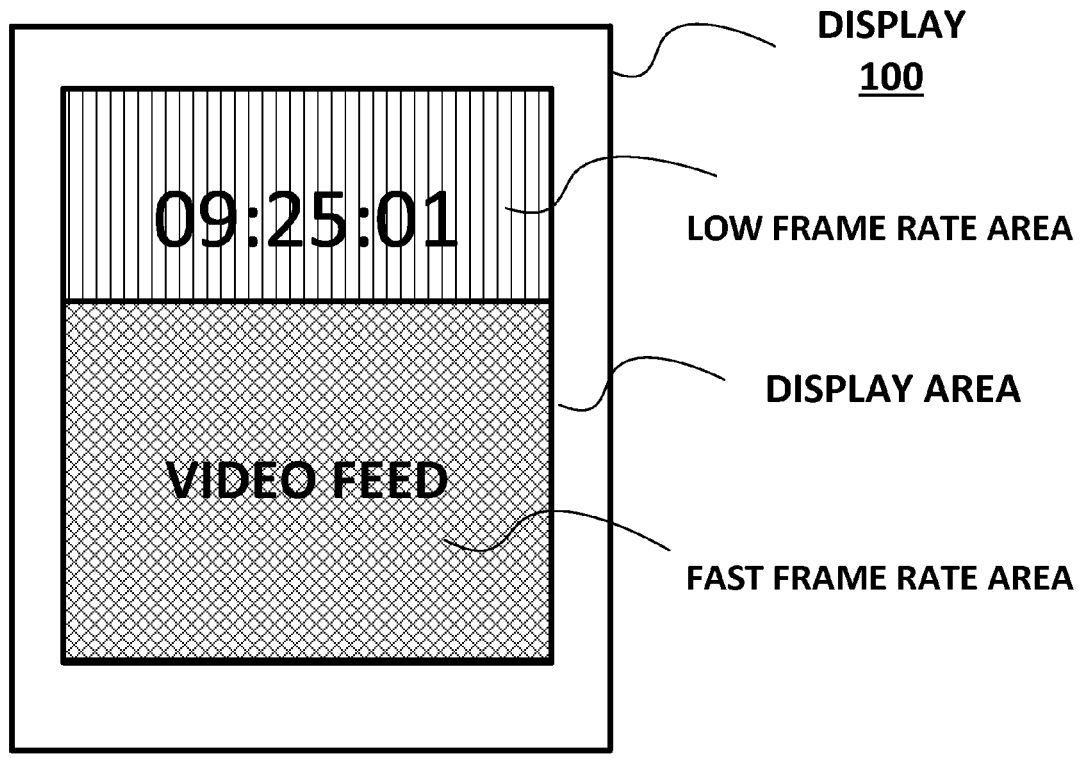
FIG. 4 is an illustration describing an exemplary display mode of the display of the present disclosure.

FIG. 4 illustrates an exemplary screen which can be presented by the display 100, in which a part of the display area is driven with low frame rate. In this example, the display area is divided into two parts; the low frame rate part that is displaying relatively slow changing image content (e.g., current time) and the fast frame rate part that is displaying relatively fast changing image content (e.g., movie). In this example, the first part of the display area, which presents the current time to the seconds, may only need to be refreshed at one frame per second.

In a conventional display, however, the driving circuits would output signals (e.g., scan signal, data voltage, emission signal, etc.) sequentially to the pixel circuits in the display area at a predetermined frequency so that the entire display operates at a fixed frame rate (e.g., 60, 120, 240 Hz, etc.). In a display operating at 60 frames per second, signals supplied to the pixel circuits in the first part of the display area for 59 frames may be viewed as waste of power, at least in theory.

Accordingly, in some embodiments, the frequency of signals to the pixel circuits provided from at least one of the driving circuits is controlled depending on the image content to be presented on the display 100. This can be achieved by adding switching circuits to the gate driver GD, to the data driver DD, or to both the gate driver GD and the data driver DD, which is controllable by the low refresh rate LRR signal LRR.

In one embodiment, the data driver DD is configured to receive the low refresh rate signal LRR from the timing controller TC, and to control the refresh rate of image content. For example, when the image content is a fast changing image contents (e.g., video), the timing controller TC provides the low refresh rate signal LRR in a predetermined state (e.g., low state) to the data driver DD so that the data driver DD processes image data at a preset normal refresh rate. This means that data voltage Vdata are output at a normal refresh rate. In another words, image data for each frame is processed every frame period. In this regard, the data driver DD maintains buffers installed therein in an on state when the data driver DD operates in a normal refresh mode.

On the other hand, the timing controller TC provides the low refresh rate signal LRR of a predetermined state (e.g., high state) to the data driver DD when the image data is a still content (or slow changing image content). In this case, the data driver DD processes the image data at a lower refresh rate than the normal refresh rate. In the low speed refresh mode, image data of one frame is processed for a predetermined frame period only, such that the data voltages Vdata are output at a low refresh rate. To this end, the data driver DD may maintain buffers installed therein in "On" state for the specific frame period only, and maintains the buffers in "Off" state for the remaining frame periods. By turning off of the buffers in the data driver DD, the pixel circuits are updated with new data voltages Vdata only every specific frame period, and this can reduce the power consumption of the display.

Figure 5:
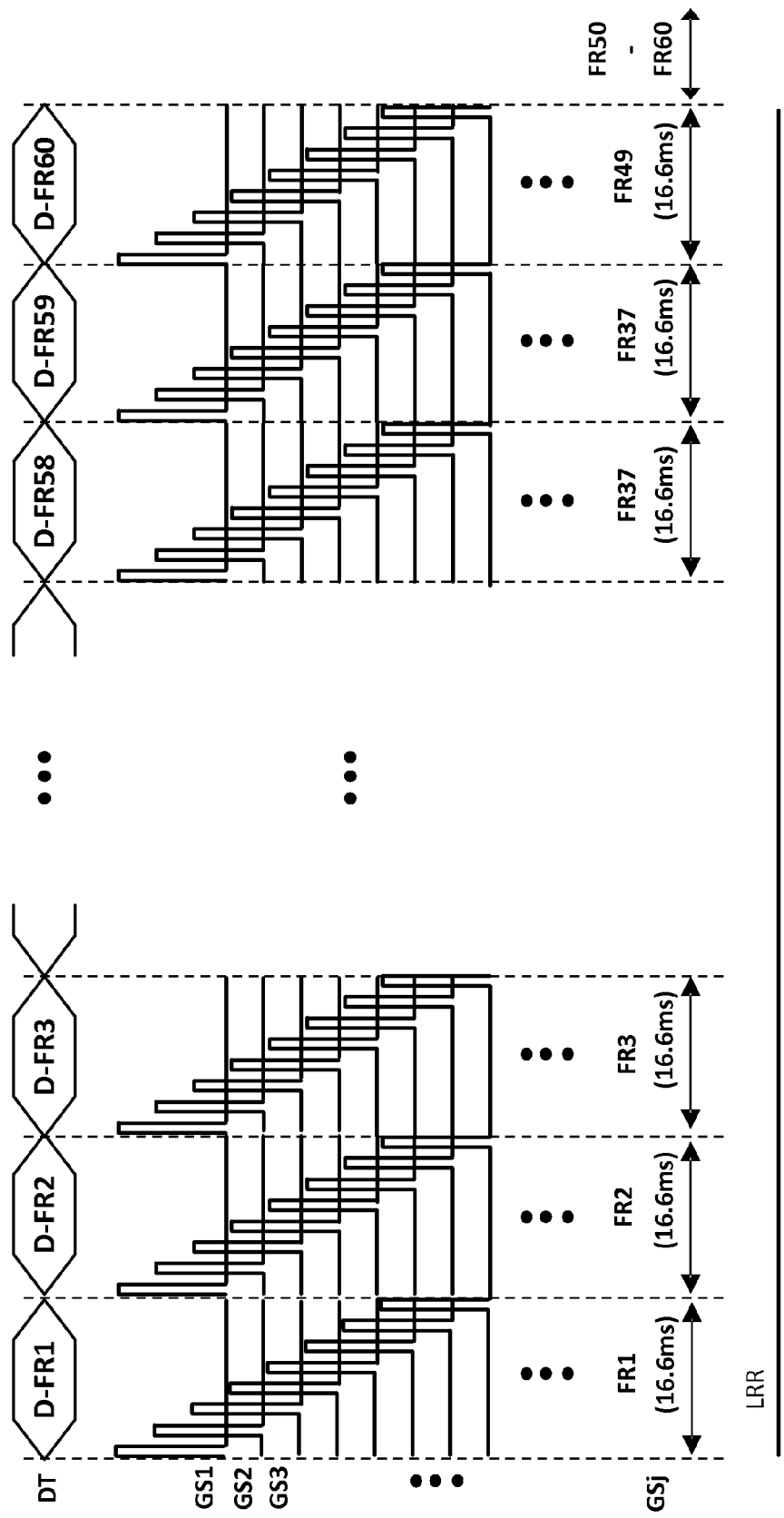
FIG. 5 is a timing diagram illustrating an exemplary operation of the display described in the present disclosure in a normal operation mode.

FIG. 5 is a timing diagram illustrating an exemplary operation of the timing controller TC, the gate driver GD, and the data driver DD in a normal refresh mode. In a normal refresh mode, the low refresh rate signal LRR from the timing controller TC is maintained in a low state so that the switching circuits coupled to the data driver DD are turned on. The gate signals GS1 through GSj are sequentially output by the gate driver GD every frame period and the image data of every frame period FR1 through FR60 is processed by the data driver DD. Assuming that a length of one frame is 16.6 ms, approximately 60 sheets of frames are processed per second, as seen from FIG. 11. That is, the data driver DD performs a refresh operation at 60 Hz.

Figure 6:
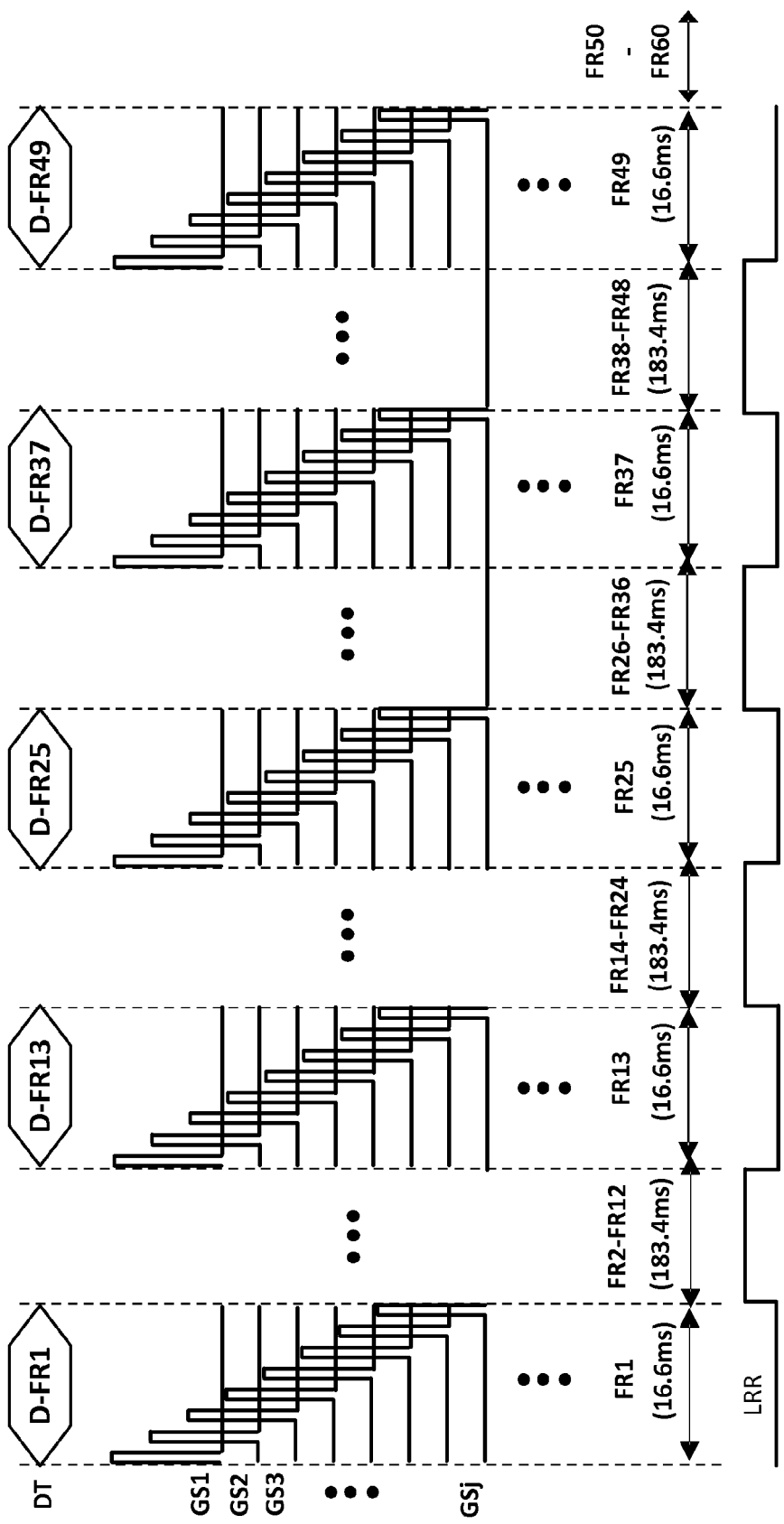
FIG. 6 is a timing diagram illustrating an exemplary operation of the display described in the present disclosure in a low refresh rate mode.

FIG. 6 is a view for explanation of operations of the timing controller TC, the gate driver GD, and the data driver DD in a low speed refresh mode. In the low speed refresh mode, the low refresh rate signal LRR from the timing controller TC is maintained in a low state for specific frame periods FR1, FR13, FR25, FR37, and FR49, and is maintained in a high state for remaining periods FR2-FR12, FR14-FR24, FR26-FR36, FR38-FR48 and FR50-FR60. Accordingly, the switching circuits coupled to the data driver DD are turned off by the low refresh rate signal LRR for 2nd through 12th frame periods FR2 through FR12, 14th through 24th frame periods FR14 through FR24, 26th through 36th frame periods FR26 through FR36, 38th through 48th frame periods FR38 through FR48, and 50th through 60th frame periods FR50 through FR60.

Even if the gate signals GS1 through GSj are sequentially output by the gate driver GD every frame period, only the image data in data frames D-FR1, D-FR13, D-FR25, D-FR37 and D-FR49 are processed during the corresponding frame periods FR1, FR13, FR25, FR37, and FR49 among the 60 frame periods. Assuming that a length of one frame is 16.6 ms, approximately 5 sheets of frames are processed per second, as seen from FIG. 12. That is, the data driver DD performs a refresh operation at 5 Hz.

Referring to FIG. 6, remaining frame periods between two specific adjacent frame periods are set such that time (e.g., 183.4 ms) corresponding to the remaining frame periods between the two specific adjacent frame periods (e.g., FR2-FR12) is greater than time (e.g., 16.6 ms) corresponding to one specific frame period (e.g., FR1) of the two specific adjacent frame periods.

In some embodiments, the low refresh rate signal LRR can be provided to the switching circuits coupled to the data driver DD during a single frame period so that only a part of the display is updated with the new data voltage Vdata. For example, the low refresh rate signal LRR may be provided to the switching circuits coupled to the data driver DD during the period of a frame in which the gate driver DD outputs scan signals on certain gate lines. For instance, the low refresh rate signal LRR can be provided to the switching circuits coupled to the data driver DD when the gate lines 10 through 100 outputs scan signal in selected frames. The pixel circuits connected to the gate lines GL10 through GL100 will not be provided with the new data voltage Vdata from the data driver DD for those selected frames. In this setting, a part of the display area (e.g., pixels connected to the gate lines GL10 through GL100) can be updated at a frequency different from the remaining part of the display area.

Figure 7:
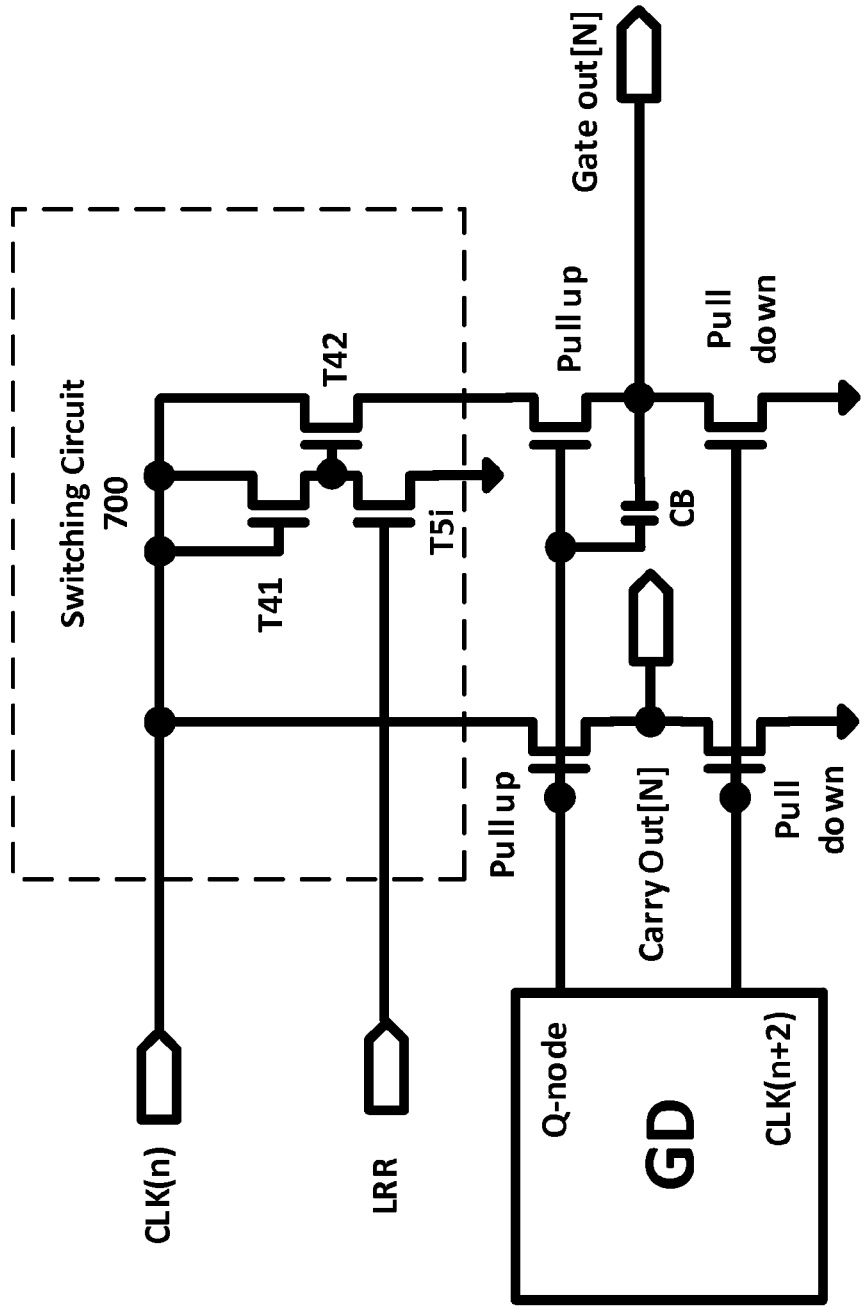
FIG. 7 is a schematic circuit diagram of an exemplary switching circuit.

While running only a part of the display area under the low refresh mode can be done by controlling the switching circuits on the data driver side, it may result in heavy load on the timing controller TC. As such, in one embodiment, the low refresh rate signal LRR is provided to the switching circuits coupled to the gate driver GD. More specifically, the gate driver GD includes a plurality of stages forming a shift register, and a switching circuit 700 can be coupled to each of the stages or some of the stages as shown in FIG. 7.

The switching circuit 700 is implemented with one or more of TFTs, in which at least one of the TFTs is configured to receive LRR signal for controlling output of a gate signal to the corresponding pixel circuit. When the low refresh rate signal LRR is low, the gate driver GD operates at a preset normal refresh rate. That is, the switching circuits allow the gate signals from the gate driver GD to be provided on all of the gate line [N] in sequence for each of the frames. When the low refresh rate signal LRR is high, however, frequency of the gate signals from the gate driver GD on some or all of the gate lines can be limited.

For operating the entire display area under the low refresh rate mode, the frequency of the gate start pulse signal and/or the frequency of the gate shift clock GSC can be adjusted to reduce the frequency of the pixel circuits of the display to be updated with new data voltage Vdata. To this end, a switch circuit controllable by the low refresh rate LRR signal can be used to hold off the gate start pulse signal for certain frames. Similarly, a switching circuit controllable by the low refresh rate LRR signal can be used to hold off the gate shift clock GSC to create a delay between activation of each shift register. Also, a switching circuit can be configured to control the gate output enable signal GOE for each of the stages based on the low refresh rate LRR signal. For instance, when the low refresh rate signal LRR is high, the gate output enable signal GOE can be set to low so that the pixels are not loaded with the data voltage Vdata.

Regardless of how the switching circuit 700 is used to implement the low refresh rate mode, the pixel circuits operating under the low refresh rate mode are not loaded with the new data voltage Vdata for one or more frames. The pixels which are not loaded with the data voltage Vdata emits luminance based on the data voltage Vdata that was loaded in the prior frame supplied with the data voltage Vdata.

Uniform driving of OLED pixels with adjustable refresh rate as described above is not easy. The difficulty in uniform driving of the OLED pixels in the display largely attributes to (1) current-dependent luminance of the OLED, (2) large TFT dimensions with high gate-to-drain capacitance (Cgd) and gate-to-source capacitance (Cgs), and (3) threshold voltage and mobility variations of the TFTs in the pixel circuits. Also, the size and the mobility ($\mu$) of a TFT is generally proportional, but the size of the pixel area limits the number of TFTs and their sizes. Accordingly, mobility ($\mu$) of the TFTs can be limited by the space available for the pixel circuit and/or driving circuits on the TFT backplane.

As described above, oxide TFT has excellent voltage holding ratio. However, sensing of the Vth can take significantly longer with an oxide TFT (e.g., as much as 7 times of an LTPS TFT). Also, using oxide TFTs to implement the driving circuit in the non-display area may increase the bezel size. As such, implementing the driving circuit entirely by using the oxide TFT may not provide sufficient driving frequency during the normal refresh mode of the display 100. Moreover, the driving TFT DT within the pixel circuit must maintain the stable driving voltage during the period in which the data is not processed by the data driver DD. Further, the driving voltage may be reduced by a parasitic capacitance while the switching transistor is turned off.

For all of the reasons stated above, operating the display with the low refresh rate mode described above may not be feasible with a TFT backplane employing a single type of TFTs. However, driving the display 100 with the adjustable refresh rate as described in the present disclosure can be realized by using a TFT backplane implemented with multiple types of a combination of oxide TFTs and LTPS TFTs.

To obviate at least one or more problems stated above, the TFT backplane used in the embodiments of the present disclosure are made with both oxide TFTs and LTPS TFTs. In one embodiment, the pixel circuits are implemented with oxide TFTs while the driving circuits formed in the non-display area (e.g., gate driver GD, (de)multiplexer and/or source driver) is implemented with LTPS TFTs.

The semiconductor of the oxide TFT in the present disclosure may be made from various metal oxides. Examples of a constituent material of the oxide semiconductor layer includes a quaternary metal oxide such as an indium-tin-gallium-zinc-oxide (In—Sn—Ga—Zn—O)-based material, a ternary metal oxide such as an indium-gallium-zinc-oxide (In—Ga—Zn—O)-based material, an indium-tin-zinc-oxide (In—Sn—Zn—O)-based material, an indium-aluminum-zinc-oxide (In—Al—Zn—O)-based material, an indium-hafnium-zinc-oxide (In—Hf—Zn—O)-based material, a tin-gallium-zinc-oxide (Sn—Ga—Zn—O)-based material, an aluminum-gallium-zinc-oxide (Al—Ga—Zn—O-based material) and a tin-aluminum-zinc-oxide (Sn—Al—Zn—O)-based material, and a binary metal oxide such as an indium-zinc-oxide (In—Zn—O)-based material, a tin-aluminum-zinc-oxide (Sn—Zn—O)-based material, an aluminum-zinc-oxide (Al—Zn—O)-based material, a zinc-magnesium-oxide (Zn—Mg—O)-based material, a tin-magnesium-oxide (Sn—Mg—O)-based material, an indium-magnesium-oxide (In—Mg—O)-based material, an indium-gallium-oxide (In—Ga—O)-based material, an indium-oxide (In—O)-based material, a tin-oxide (Sn—O)-based material and a zinc-oxide (Zn—O)-based material. Composition ratios of the elements included in the respective oxide semiconductor materials are not particularly limited, and may be adjusted at various composition ratios.

Initial Vth and mobility variations of the LTPS TFT exist due to grain size and boundary variations. In contrast, the initial Vth of oxide TFTs are substantially uniform within a TFT backplane. Accordingly, uniform Vth for the driving TFT and/or the switching TFT can be obtained by implementing the pixel circuit with oxide TFTs. As such, pixel circuit implemented with oxide TFTs does not suffer from the pixel-to-pixel threshold voltage (Vth) variation issue exhibited in LTPS TFT based backplane, even in a large sized TFT backplane 110.

With the driving circuit implemented with LTPS TFTs, signals to the pixel circuit can be provided at a higher clock rate than the case in which the driving circuit on the TFT backplane is also implemented with oxide TFTs. The area of the TFT backplane reserved for the driving circuit may be small enough to obtain sufficiently uniform threshold voltage among the TFTs of the driving circuit even when it is implemented with LTPS TFTs.

Efficient use of the space within the TFT substrate is yet another benefit offered by the TFT backplane using the oxide TFT implemented pixel circuit and the LTPS TFT implemented driving circuit. Although the size of individual oxide TFT may be larger than the size of an LTPS TFT, uniform threshold voltage of the oxide TFTs in the active area eliminates the need for a complex compensation circuit often required in an LTPS TFT implemented pixel circuit. Elimination of such compensation circuit can simplify the design of the pixel circuit.

Further, the low currant leakage characteristic of the oxide TFT enables to reduce the size of the capacitor that needs to be formed in each of the pixels. The reduction of TFT counts and the size of the capacitor can reduce the overall size of the pixel circuit. This allows to provide higher-resolution display within a limited space or increase the size of light transmissive area within a pixel for a transparent display. Since the reduction of the TFT counts and the size of the capacitor means less external light reflecting parts within a pixel, improvement in display quality is also expected from this TFT backplane design.

Non-display area of a TFT backplane 110 is often hidden under a masking (e.g., bezel) around the display 100. It may be desirable to minimize the non-display area of the TFT backplane 110. The size of the non-display area may be minimized by minimizing circuit complexity (e.g., transistor count) in gate driver GD. As briefly mentioned above, the mobility (μ) of LTPS TFTs is higher than that of oxide TFTs by several folds. As such, an LTPS TFT outperforms an oxide TFT even when it is fabricated several folds smaller than the oxide TFT. As a consequence, relatively smaller size of LTPS TFT provides condensed driving circuit in the non-display areas of the TFT backplane 110, thereby reducing the portion of the display 100 that needs to be covered by a bezel. In addition, LTPS TFT's on-resistance may be lower, yielding more power-efficient operation than the case in which the entire TFT backplane is formed of oxide TFTs.

In fabricating an LTPS TFT, hydrogenation of the poly-silicon semiconductor layer may be performed. However, oxide semiconductor layer, for example, an In—Ga—Zn-Oxide semiconductor layer, may be negatively affected by hydrogen. The changes in TFT characteristics after the formation of the TFT backplane may lead to various problems. Nevertheless, the TFT backplane design of the embodiment separates the area of the TFT substrate with LTPS TFTs and the area with oxide TFTs, thereby eliminating the needs for extra barrier layer as well as simplifying the fabrication of both types of TFTs on the same substrate.

In one embodiment, more elaborate optimization of a display is achieved by implementing a pixel circuit with multiple types of TFTs. That is, the type of individual TFT within a pixel circuit is carefully chosen based on its functionality, operating condition and various other requirements within the pixel circuit.

In one embodiment, an LTPS TFT is used for the third switching TFT S3 while oxide TFTs are used for the other TFTs in the pixel circuit. The third switching TFT S3 made of an LTPS TFT suffers less Vth shift caused by the bias stress during the operation, allowing more stable and accurate control of the third switching TFT S3. With the excellent off current characteristic of oxide TFT, the first switching TFT S1 and the second switching TFT S2 connected to the capacitors C1 and C2 can minimize the leakage current in the pixel circuit, thereby furthering the efficiency of the data voltage Vdata in operating the pixel circuits.

It should be noted that the third switching TFT S3 can be of an N-Type LTPS TFT or a P-Type LTPS TFT. In case of using N-Type LTPS TFT for the third switching TFT S3, the gate driver GD requires an invert circuit dedicated for providing low voltage emission signal to the third switching TFT S3.

Figure 8A:
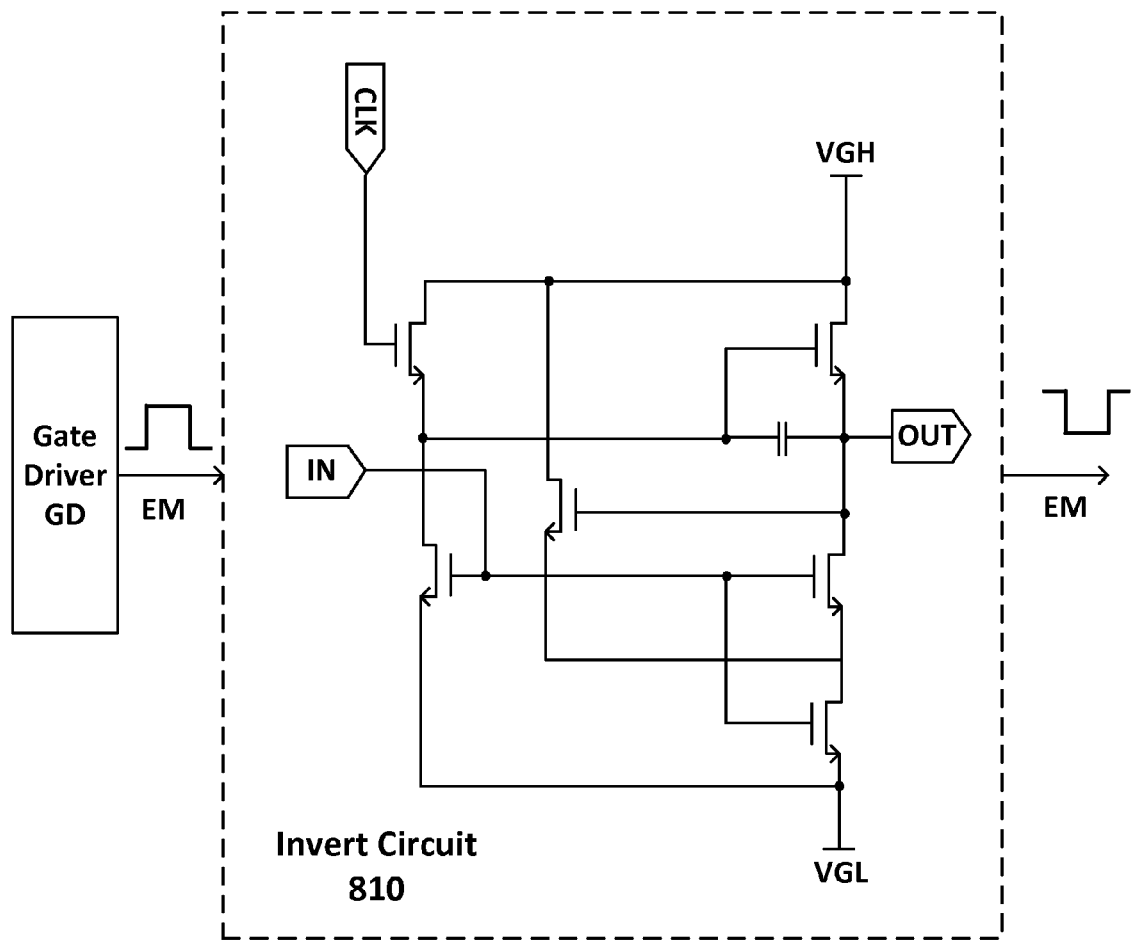
FIG. 8A is a schematic circuit diagram of an exemplary invert circuits.

FIG. 8A is a schematic diagram illustrating an exemplary invert circuit 810 implemented with six TFTs. As can be seen from FIG. 8A, the number of TFTs in implementing the driving circuits in the non-display area of the TFT backplane 110 can grow quite large. As such, using N-Type LTPS TFT for the third switching TFT S3 may not be the best solution when there is a TFT backplane size requirement. In addition, the needs for a clock signal CLK for driving the invert circuit 810 is yet another constraint which might complicate timing requirements of various other signals in the operation of the display 100. Furthermore, added TFTs and the clock signal would lead to more power consumption.

Figure 8B:
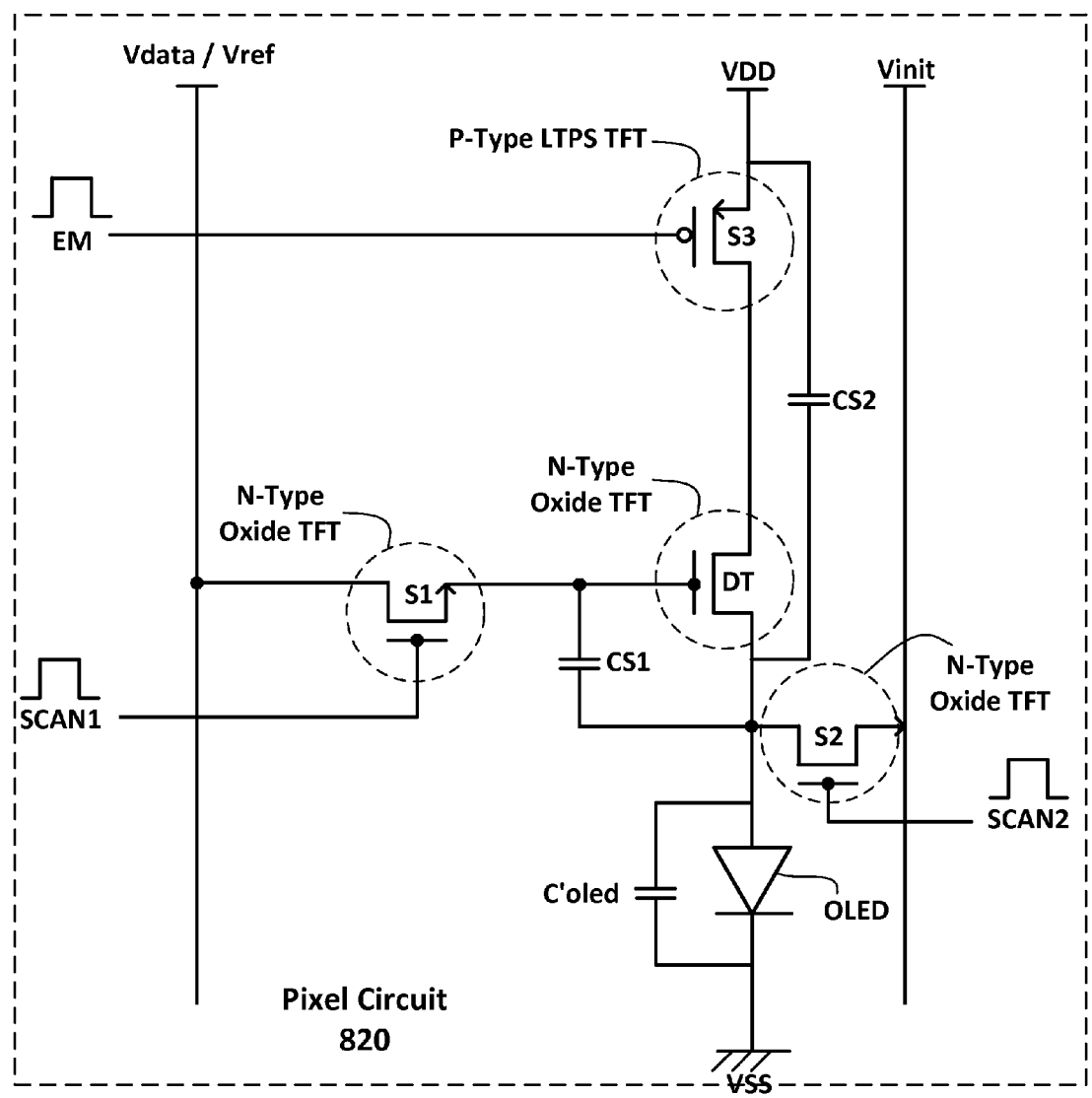
FIG. 8B is a schematic circuit diagram of an exemplary pixel circuit.
Figure 8C:
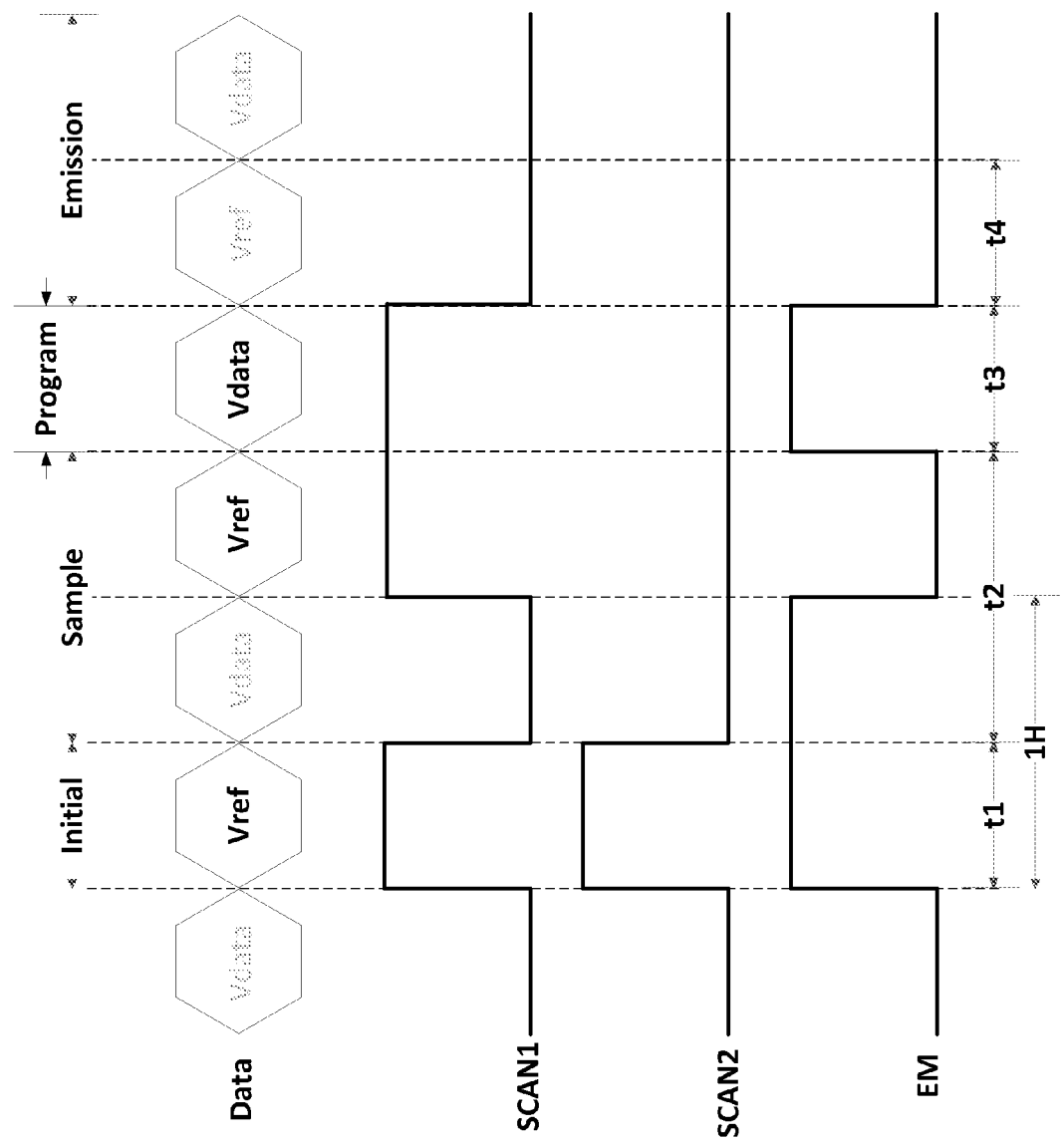
FIG. 8C is a timing diagram illustrating an exemplary operation of the pixel circuit depicted in FIG. 8B.
Figure 8D:
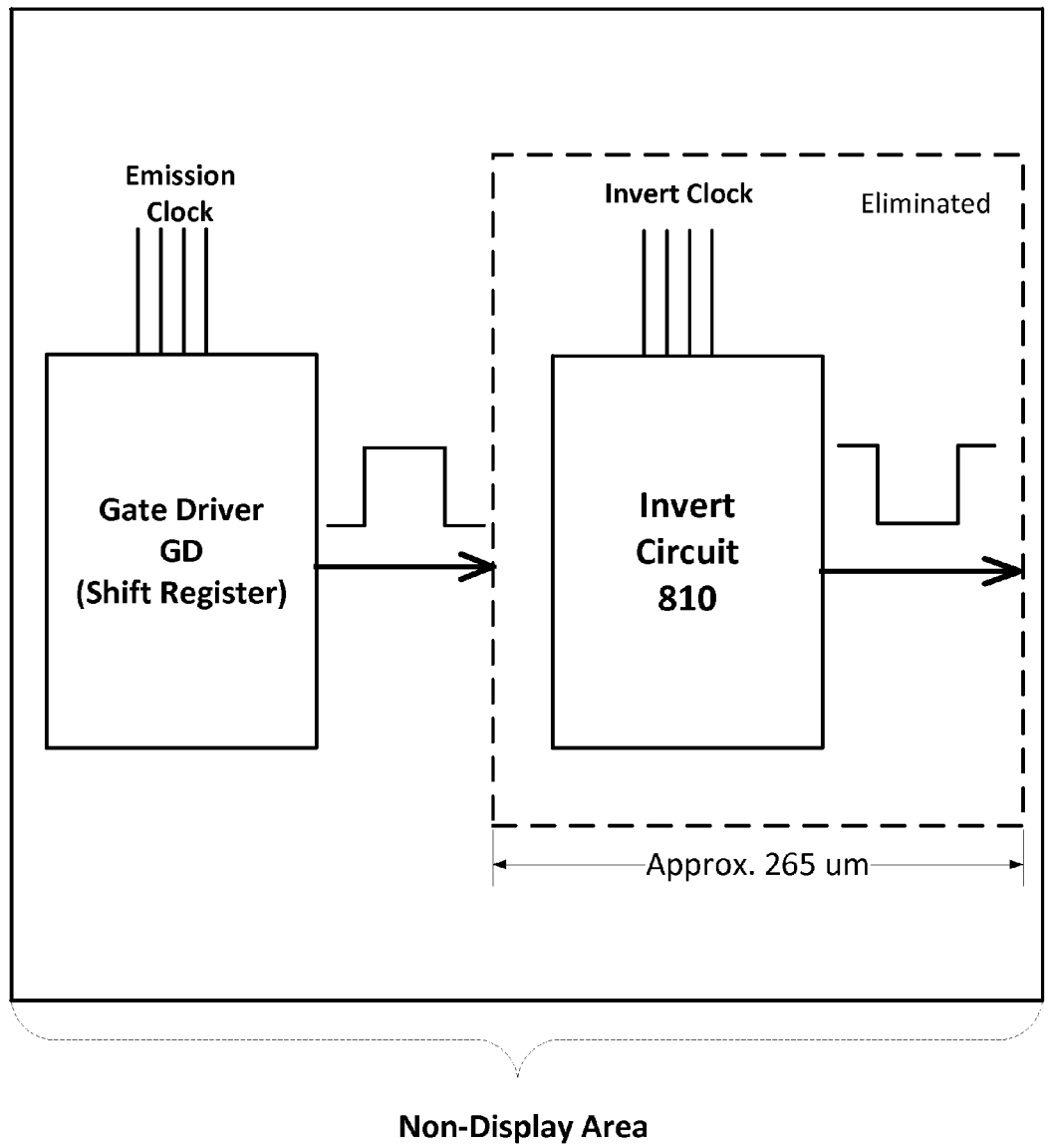
FIG. 8D is a schematic block diagram showing an exemplary driving circuit.

Accordingly, in one embodiment, a P-Type LTPS TFT can be used for the third switching TFT S3 while N-Type oxide TFT is used for the first switching TFT S1, the second switching TFT S2 and the driving TFT DT as shown in FIG. 8B. FIG. 8C is a timing diagram of operating the exemplary pixel circuit 820 depicted in FIG. 8B. In this setting, the third switching TFT S3 can be controlled with high level emission signal, and the third switching TFT S3 is configured to provide the voltage Vdd from the Vdd supply line to a drain of the driving TFT DT during the emission period t4 in which the emission signal EM is in a low level state. In other words, there is no need for inverting the emission signal to the gate of the third switching TFT S3. This allows to eliminate the invert circuit 810, thereby reducing the size of the driving circuits in the non-display area of the TFT backplane 110 as illustrated in FIG. 8D. Assuming the invert circuit was implemented with six LTPS TFTs as shown in FIG. 8A, approximately 265 um of the non-display area can be freed by eliminating the invert circuit 810. Elimination of the invert circuit 810 also means elimination of clock signals, leading to simple and more power efficient driving method.

It should be noted that various other combinational uses of LTPS TFTs and oxide TFTs in a pixel circuit are possible. Similar to the third switching TFT S3, one or more TFTs of a pixel circuit and/or one or more TFTs of a driving circuit (e.g., gate driver GD, multiplexer, etc.) that are more likely to experience bias stress than other TFTs of the respective circuit can be selectively formed of LTPS TFT. Also, switching TFTs that are connected to the capacitors CS1 and/or CS2 can be selectively formed of oxide TFT to reduce the leakage current. For example, the first switching TFT S1 and the second switching TFT S2 may be formed of oxide TFT, while the driving TFT DT and the third switching TFT S3 are formed of LTPS TFT. Further, P-Type LTPS TFT can be used for TFTs within a circuit, which require inverted gate signals for operation.

In an embodiment, TFTs connected to the storage capacitor is formed of oxide TFT to minimize the leakage current from the capacitor while using LTPS TFT for the driving TFT DT. For instance, the first switching TFT S1 and the second switching TFT S2 can be formed with an LTPS TFT to minimize the leakage current from the storage capacitors C1 and C2. Further, TFTs in the pixel circuit and/or the driving circuit turned on for extended period of time for operating the display 100 by adjusting the refresh rate can be formed of LTPS TFT. For example, the third switching transistor S3 that is controlled by the emission signal EM can be formed with an LTPS TFT. Also, LTPS TFT can be used for the TFTs that implements the switching circuits coupled to the gate driver GD and/or the data driver DD. In particular, the TFT that is applied with the high state low refresh rate signal LRR can be formed of LTPS TFT (e.g., TFT T5i in the switching circuit 700).

Figure 9A:
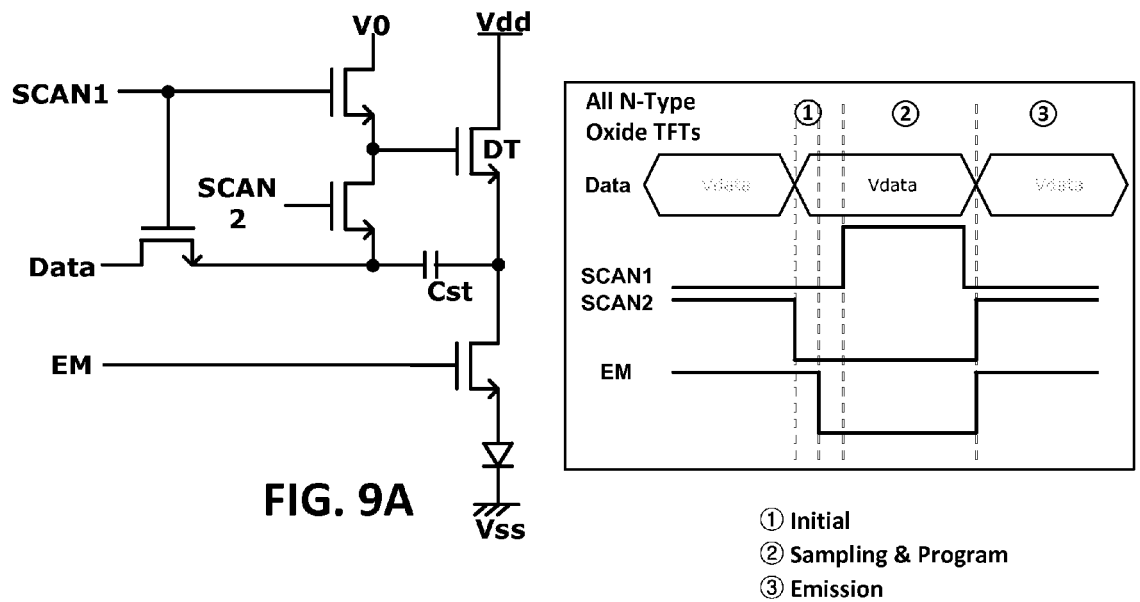
FIGS. 9A and 9B are schematic circuit diagrams of exemplary pixel circuits and timing diagrams illustrating their operation.
Figure 9B:
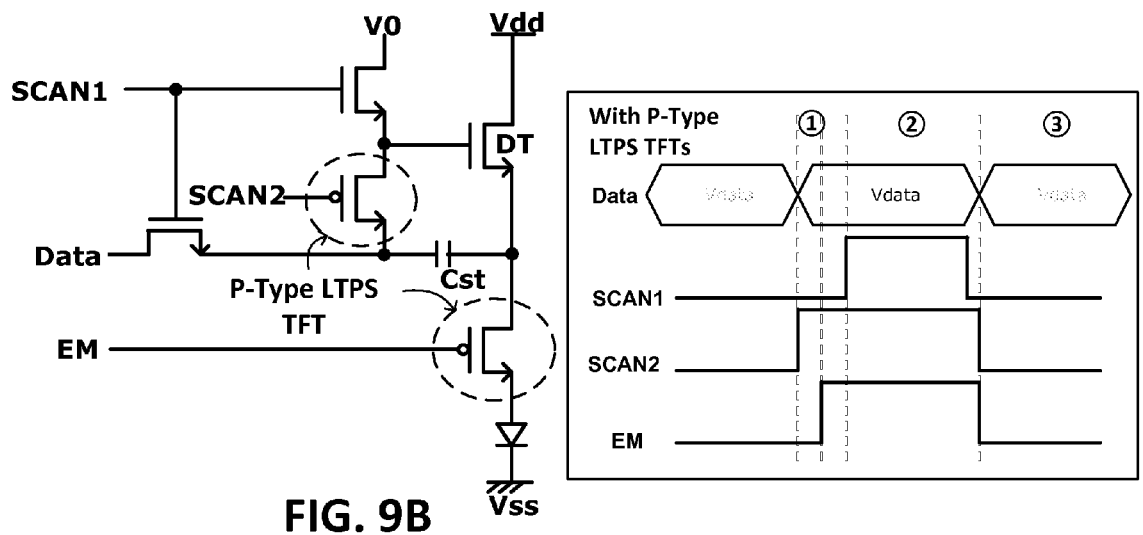

FIGS. 9A and 9B illustrate comparison between exemplary 5T1C pixel circuits, one of which is implemented entirely with N-Type oxide TFTs and another pixel circuit implemented with the combination of N-Type oxide TFTs and P-Type LTPS TFTs. In the pixel circuit implemented entirely with N-Type oxide TFTs in FIG. 9A, the switching TFTs having their gate electrode connected to the second scan line (SCAN2) and the emission signal line EM are configured to be "On" for most of the time in operating the pixel circuit. As discussed above, those switching TFTs are likely to be affected by the positive bias temperature stress, resulting in permanent Vth shift. These TFTs can be formed with P-Type LTPS TFTs as shown in FIG. 9B, so that they can better withstand against the bias stress during the operation. Many additional advantages, ranging from simpler gate driver GD and driving method, to lower leakage current and power consumption, can be obtained by the combined use of P-Type LTPS TFTs and N-Type oxide TFTs in a 5T1C pixel circuit.

In the examples described above, either an LTPS TFT or an oxide TFT was selectively used for a particular TFT of a circuit. In some embodiments, however, both LTPS TFT and oxide TFT can be used jointly to enhance a functionality of a TFT in a circuit. For instance, the low carrier mobility of the oxide TFT (as compared to LTPS TFT) becomes the bottleneck for achieving high luminance from the OLED when the oxide TFT is used as a driving TFT in a pixel circuit. The low mobility of oxide TFT, on the other hand, makes it convenient to express wide range of gray levels at low luminance level of the OLED. In contrast, higher electron mobility of LTPS TFT makes it easier to achieve higher luminance level when it serves as the driving TFT in a pixel circuit. With higher electron mobility, LTPS TFT is more sensitive to voltage change, and thus precise voltage control is needed to create gray levels at high luminance level.

Figure 10:
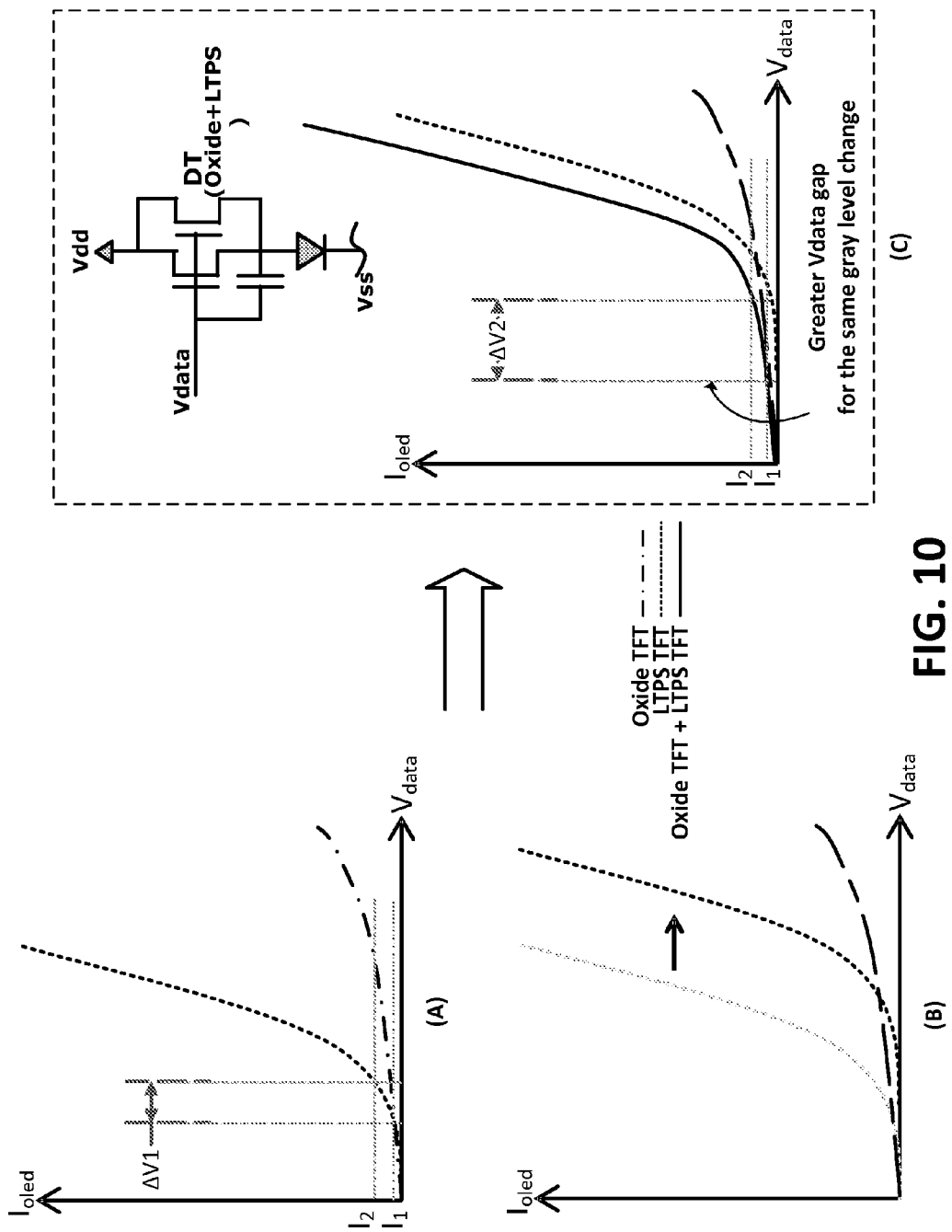
FIG. 10 is a schematic circuit diagram of an exemplary pixel circuit, and a set of graphs showing the characteristic of the pixel circuit.

Accordingly, in one embodiment, a driving TFT in a pixel circuit is implemented with an oxide TFT and an LTPS TFT, which are connected in parallel as illustrated in FIG. 10. In the graph (a), the current needed by an LTPS based driving TFT DT to express the first gray level and the second gray level are marked with $I_1$ and $I_2$, respectively. The amount of change in data voltage Vdata for expressing the second gray level from the first gray level is marked with $\Delta V1$. The gate of the oxide TFT and the gate of the LTPS TFT are connected to the same gate line. Further, the Vth of the LTPS TFT in this example is configured such that the LTPS TFT is activated in high luminance level (i.e., high Ioled) as shown in graph (b). In this configuration, change in the amount of data voltage Vdata necessary for expressing gray level difference at low luminance level (i.e., Low Ioled) becomes larger as illustrated by the graph (c), and this makes it convenient to control the pixel circuit at wide ranges of gray levels at both the low and high luminance levels.

Figure 11:
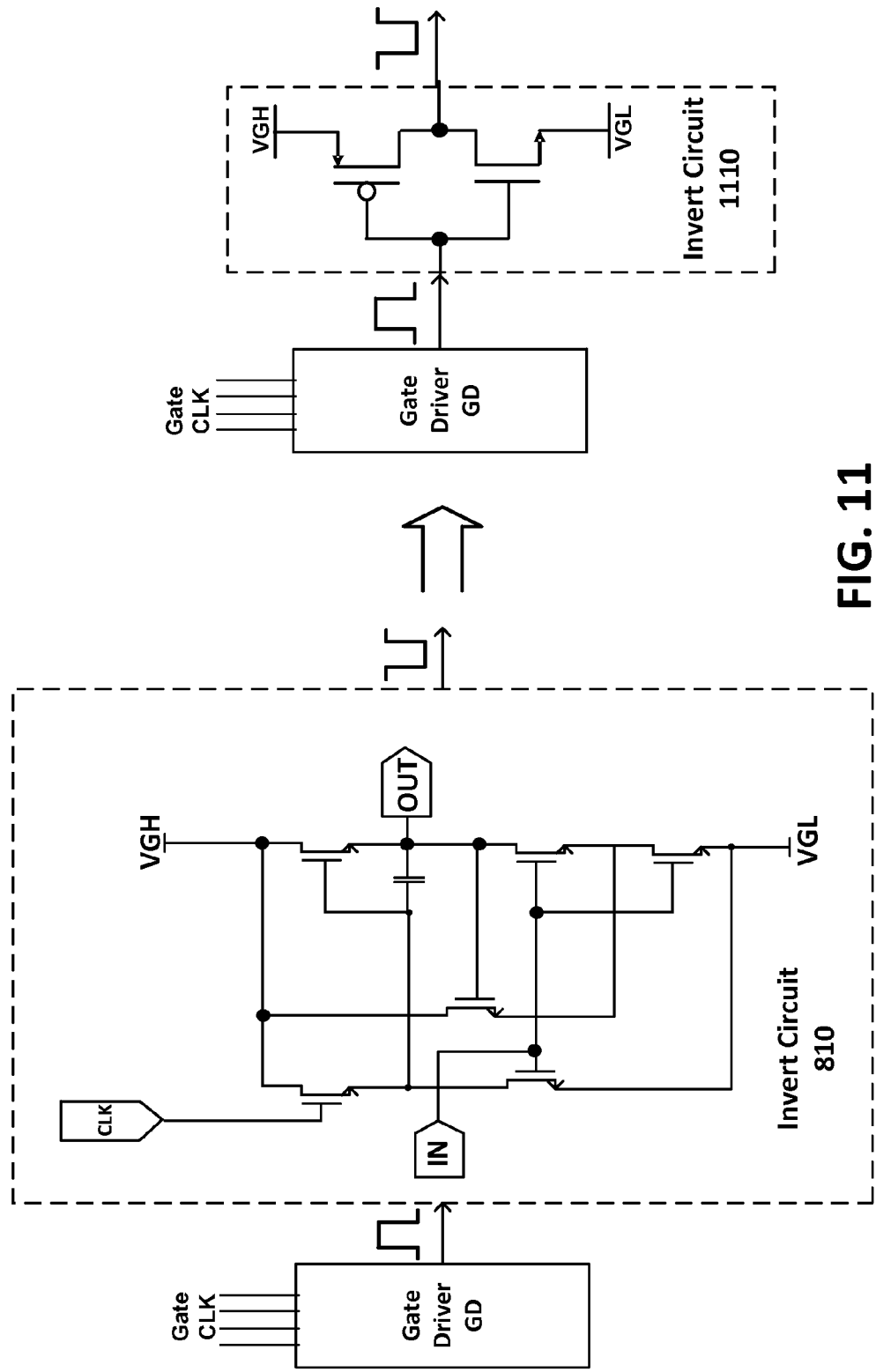
FIG. 11 is a schematic circuit diagram of an exemplary invert circuits.

As mentioned above, driving circuits implemented on the non-display area of the TFT backplane 110 can also be formed of a combination of LTPS TFTs and oxide TFTs. One example where the combination of oxide TFT and LTPS TFT can be used in a driving circuit is an invert circuit (e.g., invert circuit 510). As previously explained, a considerable number of TFTs is required to implement an invert circuit by using only one type of TFTs. Such an invert circuit can be implemented with only two TFTs by using a combination of N-Type oxide TFT and P-Type LTPS TFT as illustrated in FIG. 11.

The simplified invert circuit 1110 is particularly useful when an inverted emission signal is used to control an N-Type switching TFT (either N-Type Oxide TFT or N-Type LTPS TFT) of a pixel circuit. With an invert circuit implemented with a combination of P-Type LTPS TFT (W/L=90μ/6.5μ+6.5μ) and an N-Type oxide TFT (W/L=450μ/6.5μ) connected to a gate line (R 14 kΩ, C 30 pF), tR (rise time) of 0.68 μs and tF (fall time) of 2.4881 is can be expected.

Another example of using a combination of P-Type LTPS TFT and N-Type oxide TFT in a driving circuit implemented the non-display area of a TFT backplane 110 is a multiplexer connected to data driver DD for control of data voltage Vdata. For instance, a multiplexer connected to the data driver DD may be implemented with a plurality of N-Type oxide TFTs and a plurality of P-Type LTPS TFTs, in which a pair of each type of TFTs share a gate line and a data line. The N-Type oxide TFT and the P-Type LTPS TFT will operate alternately based on the level of the signal from the gate line. The data driver DD may be configured to provide appropriate data voltage Vdata through the data line DL according to the timing of the gate line signal so that appropriate TFT of the pair is supplied with the data voltage Vdata. In this configuration, the number of data lines DL can be reduced in half. The number of gate line GL connected to the multiplexer is also reduced in half.

Figure 12:
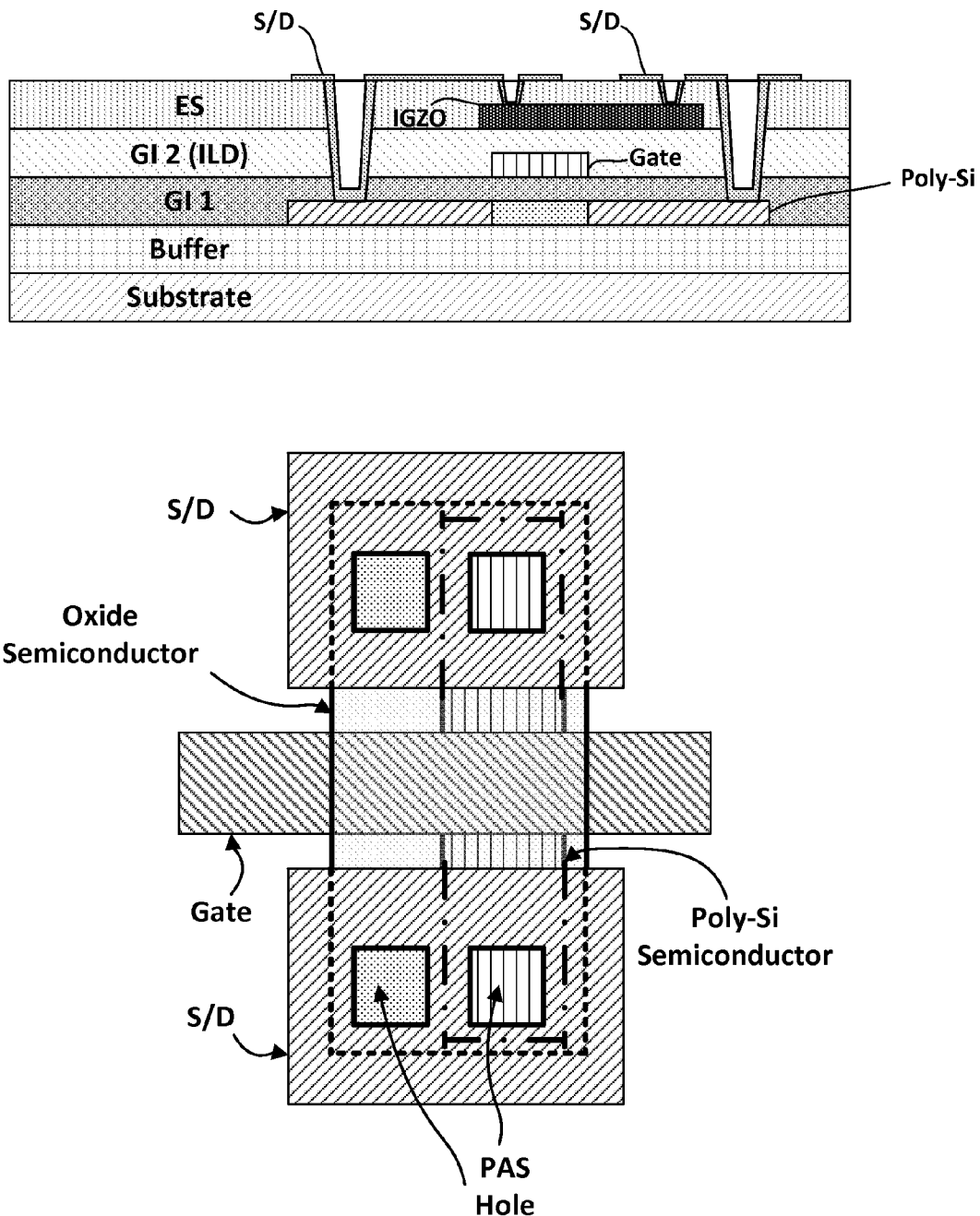
FIG. 12 is a schematic illustration of an exemplary thin-film-transistor structure.

When fabricating an oxide TFT and an LTPS TFT near each other, a bottom gate oxide TFT may be formed above a top gate LTPS TFT such that the gate electrode between the pair of TFTs is shared between the two TFTs. An exemplary configuration of overlapping oxide TFT and LTPS TFT is illustrated in FIG. 12. This structure reduces the size of the multiplexer in the non-display area of the TFT backplane, which can lead to reduced bezel size of the display.

In fabrication of TFTs, the active layer of the TFTs are often covered by one or more of passivation layers (e.g., Buffer, GI1, ILD). For instance, an interlayer dielectric (ILD) layer formed of silicon nitride (SiNx) and/or silicon oxide (SiO2) may cover the active layer. Such passivation layers can be used in hydrogenating a poly-silicon semiconductor during fabrication of LTPS TFTs. However, hydrogen ion tends to negatively shift the threshold voltage of an oxide semiconductor. Therefore, oxide TFTs are very sensitive to the effect of hydrogen ions at the back channel side, which is particularly important for manufacturing of a display.

For this reason, various configurations can be used to minimize hydrogen ions from reaching the oxide semiconductor layer, especially in the embodiments of the present disclosure where an oxide TFT and an LTPS TFT are formed over one another. Accordingly, in some embodiments of the present disclosure, passivation layers with high hydrogen contents may be used under the poly-silicon semiconductor of the LTPS TFT, and the gate metal of the LTPS TFT can be configured to shield the at least the channel portion of the oxide semiconductor layer. The passivation layers under the poly-silicon semiconductor layer having high hydrogen contents can be used in hydrogenating the poly-silicon semiconductor layer. Passivation layers on upper side of the poly-silicon semiconductor can be formed of materials with low hydrogen contents, such as SiO2. Here, the low hydrogen content passivation layer, may be formed to have a thickness that is equal to or greater than the thickness of the passivation having high hydrogen content. For instance, for SiNx layer of 2000 angstroms, a SiO2 layer of at least 2000 angstroms may be formed. Further, the shielding metal may be provided connected to Vref or VDD so that the oxide semiconductor is not affected by mobile charge from the layers there under.

In some embodiments, one or more metal oxide layer capable of blocking hydrogen (e.g., $Al_2O_3$, $Ta_xO_y$, other metal oxide) can be formed between the passivation layers with high hydrogen contents and the oxide semiconductor layer. Such hydrogen blocking layers can be formed after the hydrogenation of the poly-silicon semiconductor layer, and the oxide semiconductor layer can be formed after the formation of the hydrogen blocking layer.

While the low refresh rate driving mode and the TFT backplane suitable for such a driving mode have been described in the context of OLED display, it should be appreciated that the similar TFT backplane can be used for a liquid crystal display (LCD) to implement the low refresh rate mode.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of driving a display, comprising:
   turning on a first switching thin-film-transistor (TFT) and a second switching TFT in a plurality of pixel circuits to initialize a first node and a second node, during an initialization period;
   turning on the first switching TFT, during a first part of a sampling period and turning on a third switching TFT, during a second part of the sampling period to sense a threshold voltage of a driving TFT in the plurality of pixel circuits;
   turning on the first switching TFT to write a data voltage into a storage capacitor in the plurality of pixel circuits, during a programming period; and
   turning on the third switching TFT to cause the driving TFT to supply drive current to an organic light emitting diodes in the plurality of pixel circuits, during an emission period, wherein the first switching TFT and the second switching TFT are formed of oxide TFT, and wherein the third switching TFT and the driving TFT are formed of poly-silicon TFT.

2. The method of claim 1, further comprising:
   providing a low refresh rate signal to a driving circuit to adjust a frequency of signals supplied to the plurality of pixel circuits.

3. The method of claim 2, wherein the driving circuit provided with the low refresh rate signal is a gate driver, and the gate driver is prevented from supplying a gate signal on a gate line connected to the plurality of pixel circuits for a predetermined number of frames.

4. The method of claim 2, wherein the driving circuit provided with the low refresh rate signal is a data driver, and the data driver is prevented from supplying data voltage on a data line connected to the plurality of pixel circuits for a predetermined number of frames.

5. The method of claim 3, wherein a touch scan is performed in the display while the gate driver is prevented from supplying the gate signal on the gate line.

6. The method of claim 4, wherein a gate driver provides gate signals to the plurality of pixel circuits in a sequential order.

7. A display comprising:
   a display area having a first frame rate area and a second frame rate area, the first frame rate area including a first set of pixel circuits and the second frame rate area including a second set of pixel circuits; and
   a non-display area having a driving circuit configured to drive the first set of pixel circuits at a first frame rate and the second set of pixel circuits at a second frame rate lower than the first frame rate.

8. The display of claim 7, wherein the driving circuit is a gate driver, which is configured to provide a gate signal to the first set of pixel circuits at the first frame rate and to provide the gate signal to the second set of pixel circuits at the second frame rate lower than the first frame rate.

9. The display of claim 8, wherein the gate driver is coupled to a switching circuit, which is controllable by a signal transmitted from a timing controller.

10. The display of claim 7, wherein a pixel circuit of the first set of pixel circuits and the second set of pixel circuits includes an oxide thin-film-transistor (TFT) and the driving circuit includes a poly-silicon TFT.

11. The display of claim 7, wherein a pixel circuit of the first set of pixel circuits and the second set of pixel circuits is implemented with an oxide TFT and a poly-silicon TFT.

12. The display of claim 11, wherein the pixel circuit of the first set of pixel circuits and the second set of pixel circuits includes a plurality of switching TFTs that are connected to a storage capacitor, wherein each of the plurality of switching TFTs connected to the storage capacitor is formed of oxide TFT.

13. The display of claim 12, wherein the pixel circuit of the first set of pixel circuits and the second set of pixel circuits further includes a third switching TFT that is serially connected to a driving TFT, wherein each of the third switching TFT and the driving TFT is formed of low-temperature-poly-silicon (LTPS) TFT.

14. The display of claim 13, wherein the storage capacitor includes a first storage capacitor and a second storage capacitor that are serially connected to each other.

15. The display of claim 14, wherein the first storage capacitor is formed between a gate of the driving TFT and a source of the driving TFT, and wherein the second storage capacitor is formed between the source of the driving TFT and a terminal of the third switching TFT that is connected to a high level voltage line.

16. The display of claim 14, wherein the first storage capacitor is formed between a gate of the driving TFT and a source of the driving TFT, and wherein the second storage capacitor is formed between the source of the driving TFT and an initial voltage line supplying an initialization voltage.

17. The display of claim 14, wherein the first storage capacitor is formed between a gate of the driving TFT and a source of the driving TFT, and wherein the second storage capacitor is formed between the source of the driving TFT and a low level voltage line supplying a low level voltage.

18. A display device, comprising:
   a display area having a first frame rate area and a second frame rate area; and
   a thin-film-transistor (TFT) backplane having a first set of pixel circuits in the first frame rate area, a second set of pixel circuits in the second frame rate area, and a gate driver in a non-display area of the TFT backplane, wherein the gate driver in the non-display area of the TFT backplane is configured to provide gate signals to the first set of pixel circuits in the first frame rate area at a first frequency and to provide gate signals to the second set of pixel circuits in the second frame rate area at a second frequency lower than the first frequency.

19. The display device of claim 18, wherein the gate driver includes a shift register with a plurality of stages, and wherein the plurality of stages are coupled with a switching circuit controllable by a low refresh rate signal for preventing the gate signals to the second set of pixel circuits.

20. The method of claim 1, wherein the sampling period is between the initialization period and the emission period.

* * * * *